United States Patent
Oohashi

(10) Patent No.: US 10,454,440 B2
(45) Date of Patent: Oct. 22, 2019

(54) DIRECTIONAL COUPLER AND WIRELESS COMMUNICATION DEVICE USING THE SAME

(71) Applicant: TDK Corporation, Tokyo (JP)

(72) Inventor: Takeshi Oohashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 17 days.

(21) Appl. No.: 15/679,928

(22) Filed: Aug. 17, 2017

(65) Prior Publication Data

US 2018/0062237 A1 Mar. 1, 2018

(30) Foreign Application Priority Data

Aug. 23, 2016 (JP) .................. 2016-163015

(51) Int. Cl.
| | | |
|---|---|---|
| *H03G 3/30* | (2006.01) | |
| *H01P 5/18* | (2006.01) | |
| *H01Q 1/48* | (2006.01) | |
| *H01Q 1/52* | (2006.01) | |
| *H03F 3/19* | (2006.01) | |
| *H03F 3/24* | (2006.01) | |
| *H03H 7/01* | (2006.01) | |

(52) U.S. Cl.
CPC ............ *H03G 3/3042* (2013.01); *H01P 5/18* (2013.01); *H01Q 1/48* (2013.01); *H01Q 1/528* (2013.01); *H03F 3/19* (2013.01); *H03F 3/245* (2013.01); *H03H 7/0115* (2013.01)

(58) Field of Classification Search
CPC .. H01P 5/18; H01P 5/185; H01Q 1/48; H01Q 1/528; H03F 3/19; H03F 3/245; H03F 3/60; H03F 2200/204; H03H 7/0115; H03H 7/48; H03H 2001/0085; H03G 3/3042
USPC ........................................ 333/17.1
See application file for complete search history.

(56) References Cited

U.S. PATENT DOCUMENTS

2012/0176208 A1* 7/2012 Shirakawa .............. H01P 5/184
333/24 R

FOREIGN PATENT DOCUMENTS

| JP | 2014-057204 A | 3/2014 |
| JP | 2015-181315 A | 10/2015 |

OTHER PUBLICATIONS

Tseng et al., "On-Chip Miniaturized 3-dB Directional Coupler using Coupled Synthesized CPWs on Integrated Passive Device (IPD) process", Proceedings of the 44th European Microwave Conference, 2014 EuMA, Oct. 6-9, 2014, Rome, Italy, pp. 81-84. (Year: 2014).*

(Continued)

*Primary Examiner* — Benny T Lee
*Assistant Examiner* — Hafizur Rahman
(74) *Attorney, Agent, or Firm* — Young Law Firm, P.C.

(57) ABSTRACT

Disclosed herein is a directional coupler that includes a main line configured to transmit a high-frequency signal, a sub line electromagnetically coupled to the main line, and a ground pattern positioned at least partially between the main line and the sub line in a plan view. The sub line includes a low pass filter having an inductance pattern and a capacitor. The ground pattern has an opening that overlaps at least the inductance pattern in a plan view.

20 Claims, 19 Drawing Sheets

(56) References Cited

OTHER PUBLICATIONS

Mini-Circuit data sheet for DIY directional coupler dated Apr. 14, 2015 (Year: 2015).*
Nash, Measuring VSWR and Gain in Wireless Systems, Microwave Journal, Nov. 2005 (Year: 2005).*
Massarini et al., Self-Capacitance of Inductors, IEEE Transactions on Power Electronics, vol. 12, No. 4, Jul. 1997, 671-676. (Year: 1997).*

* cited by examiner

DIRECTIONAL COUPLER AND WIRELESS COMMUNICATION DEVICE USING THE SAME

BACKGROUND OF THE INVENTION

Field of the Invention

The present invention relates to a directional coupler and a wireless communication device using the directional coupler and, more particularly, to a directional coupler having a wide operation frequency band and a wireless communication device using the directional coupler.

Description of Related Art

A directional coupler that extracts a part of electric power of a transmission signal output from an antenna is used in wireless communication devices such as smartphones or tablet terminals. The part of electric power extracted by the directional coupler is supplied to an automatic output control circuit as a detection signal, and the automatic output control circuit adjusts the gain of a power amplifier according to the level of the detection signal.

As the configuration of the directional coupler, those described in JP 2014-057204A and JP 2015-181315A are known. The directional couplers of JP 2014-057204A and JP 2015-181315A are each a chip component composed of a plurality of conductor layers laminated on a substrate and can extract a part of the electric power of a transmission signal by electromagnetically coupling a part of a main line through which the transmission signal is transmitted to a sub line.

In the directional couplers described in JP 2014-057204A and JP 2015-181315A, the sub line includes a plurality of planar spiral-shaped coil patterns, and a solid ground pattern having a large-area is provided among the plurality of coil patterns so as to prevent the coil patterns from interfering with each other.

However, when a large ground pattern is provided, an inductance generated by the coil pattern is reduced, so that it is necessary to increase the number of turns of the coil pattern in order to secure a desired inductance, resulting in increase in the chip size. Further, overlap between the coil pattern and the ground pattern may increase loss of the sub line. Furthermore, when a variation in the film thickness occurs between insulating films each positioned between the coil pattern and the ground pattern, a capacitance component generated between the coil pattern and the ground pattern varies, which may cause manufacturing irregularities.

SUMMARY

It is therefore an object of the present invention to provide a directional coupler capable of preventing increase in the chip size and degradation in characteristics due to overlap between the coil pattern included in the sub line and the ground pattern and a wireless communication device using the directional coupler.

A directional coupler according to the present invention includes a main line configured to transmit a high-frequency signal, a sub line electromagnetically coupled to the main line, and a ground pattern positioned at least partially between the main line and the sub line in a plan view. The sub line includes a low pass filter having an inductance pattern and a capacitor. The ground pattern has an opening that overlaps at least the inductance pattern in a plan view.

A wireless communication device according to the present invention includes an antenna, a power amplifier that supplies a transmission signal to the antenna, an automatic output control circuit that adjusts the gain of the power amplifier, and the directional coupler. The main line of the directional coupler is connected between the antenna and the power amplifier. The sub line of the directional coupler is connected to the automatic output control circuit. The automatic output control circuit adjusts the gain of the power amplifier according to a detection signal supplied from the sub line.

According to the present invention, the ground pattern has an opening, thus making the shape of the ground pattern into a loop, so that overlap between the inductance pattern included in the sub line and the ground pattern is significantly reduced. This prevents inductance reduction, allowing reduction in the chip size. Further, loss of the sub line due to overlap between the inductance pattern and the ground pattern is reduced, and a variation in a capacitance component due to a variation in the film thickness of the insulating film, so that satisfactory characteristics can be obtained.

In the present invention, the inductance pattern is preferably a planar spiral-shaped coil pattern. This allows a large inductance to be obtained.

In the present invention, the opening preferably overlaps at least the inner diameter part of the coil pattern in a plan view. The inner diameter part of the coil pattern is a part with the highest magnetic flux density. Thus, forming the opening at this part can effectively prevent reduction in the inductance.

In this case, the opening preferably overlaps all the turns of the coil pattern excluding the outermost turn thereof in a plan view. With this configuration, most part of the coil pattern does not overlap the ground pattern, allowing effective prevention of increase in loss of the sub line and a variation in a capacitance component due to a variation in the film thickness of the insulating film.

In the present invention, the coil pattern preferably includes first and second coil patterns provided on the same conductor layer, and the opening preferably overlaps at least partially both the first and second coil patterns in a plan view. With this configuration, a small-sized and high-performance directional coupler having two coil patterns can be provided. Alternatively, the coil pattern may include first, second, third, and fourth coil patterns provided on the same conductor layer. In this case, the ground pattern preferably has a first opening that overlaps at least partially both the first and second coil patterns in a plan view and a second opening that overlaps at least partially both the third and fourth coil patterns in a plan view. With this configuration, a small-sized and high-performance directional coupler having four coil patterns can be provided.

The directional coupler according to the present invention preferably further includes an input terminal connected to one end of the main line, an output terminal connected to the other end of the main line, a coupling terminal connected to one end of the sub line, an end terminal connected to the other end of the sub line, a ground terminal disposed between the coupling terminal and the end terminal and connected to the ground pattern, and a dummy terminal disposed between the input terminal and the output terminal. With this configuration, high mounting strength can be ensured by the dummy terminal.

In this case, the main line is preferably disposed in proximity to a part of the sub line provided on the same conductor layer at the portion where it bypasses the dummy terminal in a plan view and preferably overlaps other part of the sub line provided on a different conductor layer in a plan view. With this configuration, relatively weak electromagnetic coupling can be obtained at a part of the sub line, while relatively strong electromagnetic coupling can be obtained at the other part of the sub line and, hence, flat coupling characteristics can be obtained in a wider frequency band.

The capacitor is preferably disposed between the coupling terminal and the ground terminal and between the end terminal and the ground terminal in a plan view. With this configuration, a space between the terminals is effectively used, thereby allowing reduction in the chip size.

As described above, according to the present invention, there can be provided a directional coupler having a small chip size and capable of obtaining satisfactory characteristics and a wireless communication device using the directional coupler.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 15A illustrates isolation characteristics, FIG. 15B illustrates coupling characteristics, FIG. 15C illustrates insertion loss of the sub line, and FIG. 15D illustrates return loss of the coupling port;

FIG. 27A illustrates isolation characteristics, FIG. 27B illustrates coupling characteristics, FIG. 27C illustrates insertion loss of the sub line, and FIG. 27D illustrates return loss of the coupling port.

DETAILED DESCRIPTION OF THE EMBODIMENTS

Preferred embodiments of the present invention will now be explained in detail with reference to the drawings.

First Embodiment

Figure 1:
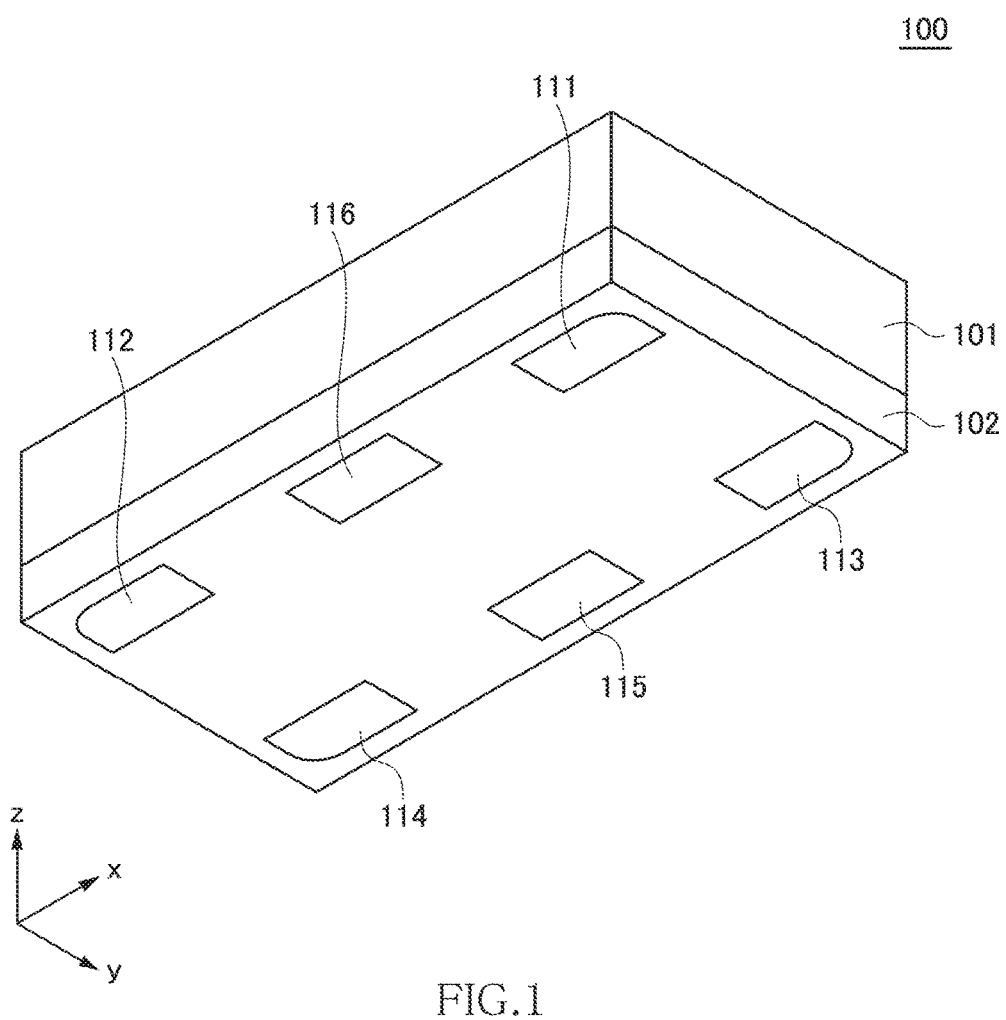
FIG. 1 is a schematic perspective view illustrating the outer appearance of a directional coupler according to a first embodiment of the present invention.

FIG. 1 is a schematic perspective view illustrating the outer appearance of a directional coupler 100 according to the first embodiment of the present invention.

As illustrated in FIG. 1, the directional coupler 100 according to the present embodiment is a chip component having a substantially rectangular parallelepiped shape and has a structure in which a laminated structure 102 is formed on a substrate 101. In FIG. 1, the laminated structure 102 of the directional coupler 100 facing downward is viewed from obliquely below. Although not particularly limited, the length of the directional coupler 100 in the x-direction is 1.0 mm, the width thereof in the y-direction is 0.5 mm, and the height thereof in the z-direction is 0.3 mm. The substrate 101 is made of, e.g., a non-magnetic material such as ferrite, serves as a support for forming the laminated structure 102, and plays a role of ensuring mechanical strength of the directional coupler 100.

The laminated structure 102 is obtained by alternately laminating a plurality of conductor layers and a plurality of insulating layers and provided with six terminal electrodes 111 to 116 on its xy plane (bottom surface). The terminal electrodes 111 and 112 are an input terminal and an output terminal, respectively, and connected to a power amplifier and an antenna, respectively, which will be described later. The terminal electrode 113 is a coupling terminal and connected to an automatic output control circuit to be described later. The terminal electrode 114 is an end terminal and connected to a terminating circuit. The terminal electrode 115 is a ground terminal and supplied with a ground potential. The terminal electrode 116 is a dummy terminal and is exclusively used for mechanical fixing to a printed circuit board. While the terminal electrodes 111 to 116 are formed on only the bottom surface of the laminated structure 102 in the example of FIG. 1, they may be formed on both the bottom and side surfaces of the laminated structure 102.

Figure 2:
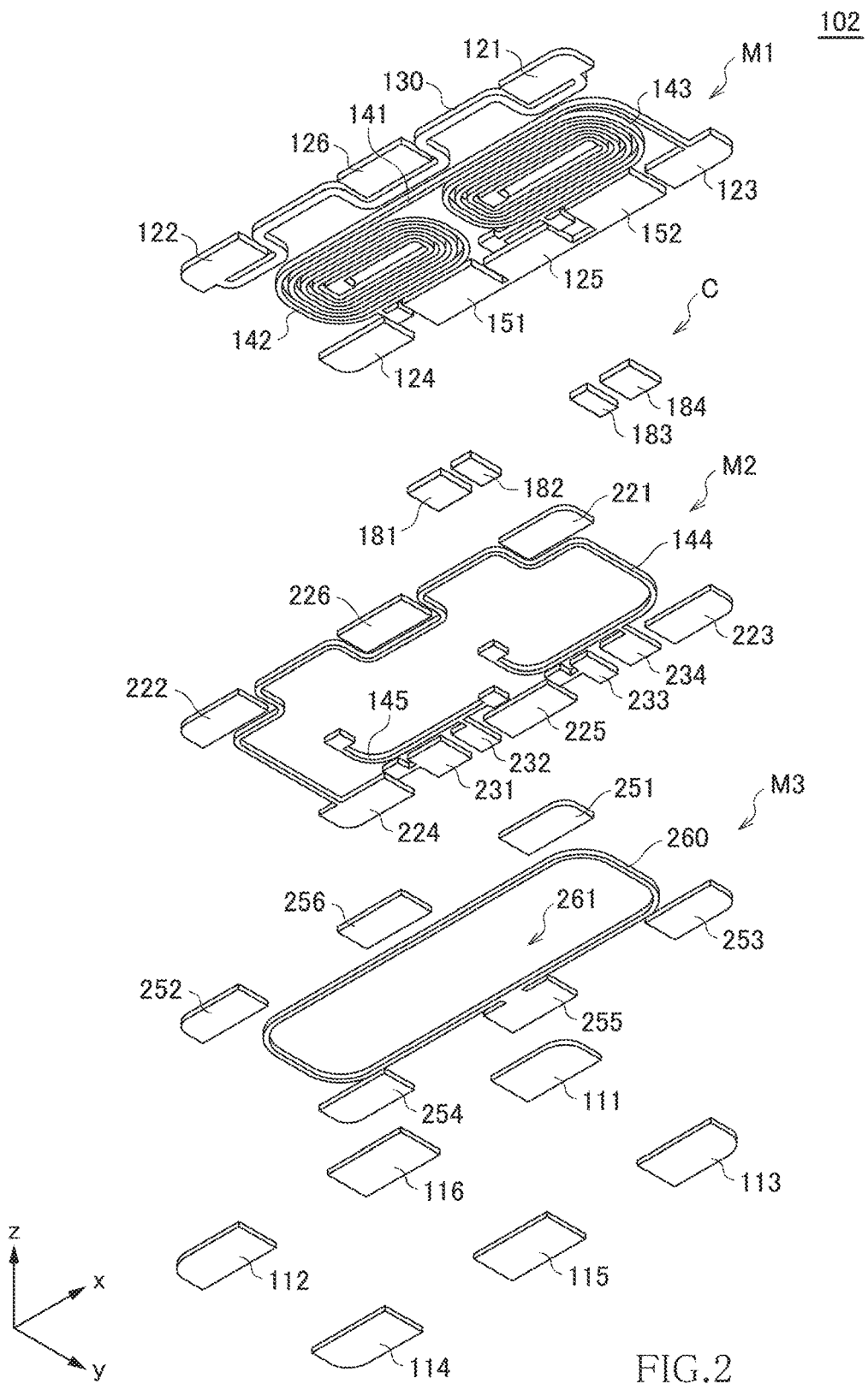
FIG. 2 is an exploded perspective view of conductor layers included in the directional coupler according to the first embodiment of the present invention.
Figure 3:
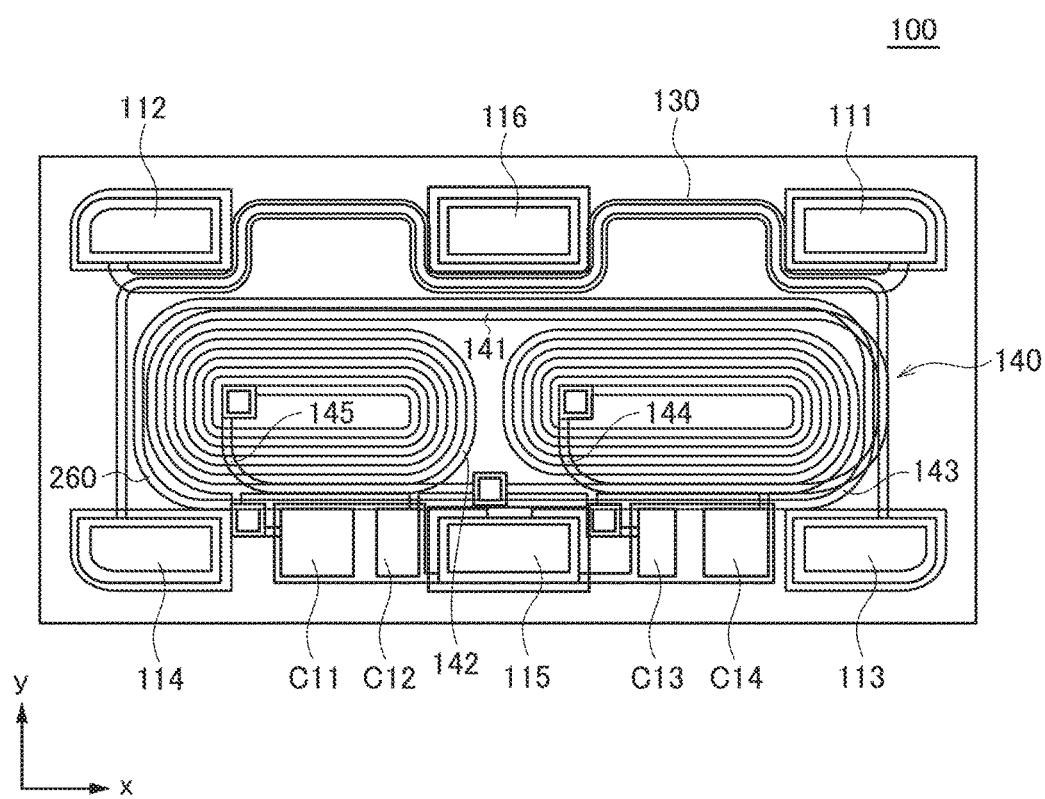
FIG. 3 is a see-through view for explaining the structure of the conductor layers included in the directional coupler according to the first embodiment of the present invention.

FIGS. 2 and 3 are views for explaining the configuration of the conductor layer included in the laminated structure 102. FIG. 2 is an exploded perspective view, and FIG. 3 is a see-through view as viewed in the lamination direction (z-direction). FIGS. 4 to 12 are plan views each illustrating the configuration of each layer constituting the laminated structure 102.

As illustrated in FIGS. 2 to 12, the laminated structure 102 is constituted of conductor layers M1 to M3, capacitor electrode layers C, and insulating layers I1 to I4 provided between the adjacent conductor layers or adjacent conductor and the capacitor electrode layers. Hereinafter, the configuration of each layer will be described in detail.

Figure 4:
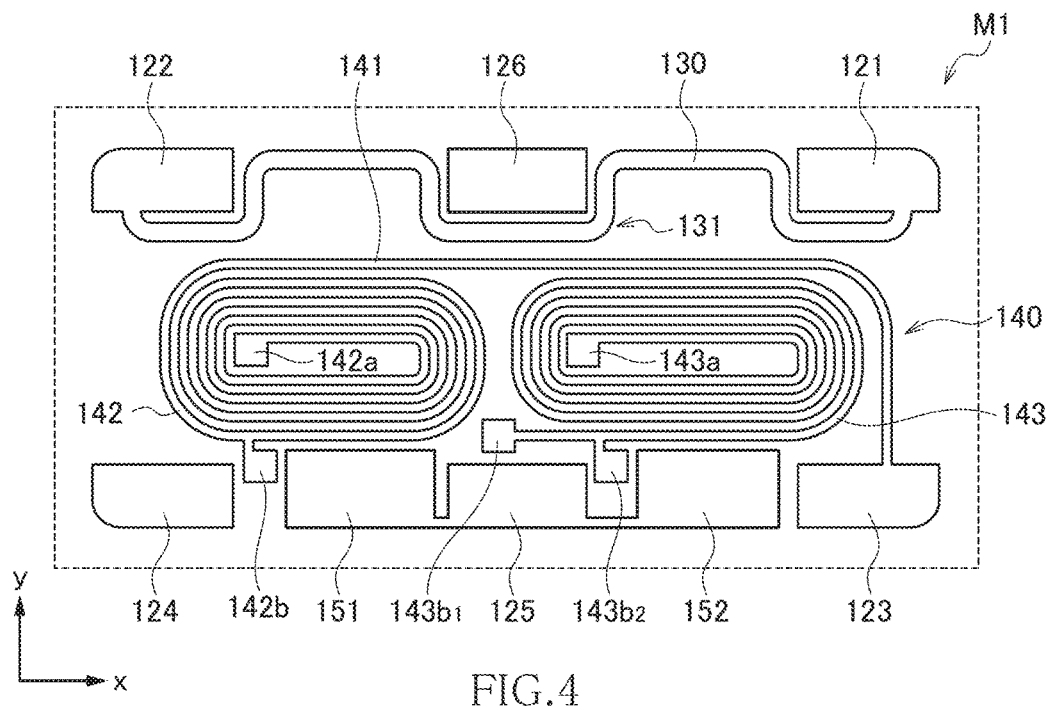
FIG. 4 is a plan view illustrating the configuration of a conductor layer.

The conductor layer M1 illustrated in FIG. 4 is provided in the lowermost layer of the laminated structure 102. The conductor layer M1 is made of a good conductor such as copper (Cu) and includes terminal electrode patterns 121 to 126, a main line 130, apart of a sub line 140, and capacitor electrode patterns 151 and 152. The conductor layers M2 and M3 to be described later are each also made of a good conductor such as copper (Cu). The terminal electrode patterns 121 to 126 are connected respectively to the terminal electrodes 111 to 116 and disposed so as to overlap the terminal electrodes 111 to 116 in a plan view (as viewed in the z-direction).

The main line 130 is a conductor pattern connecting the terminal electrode 111 serving as an input terminal and the terminal electrode 112 serving as an output terminal and laid out in a meandering fashion so as to avoid the terminal electrode pattern 126. Specifically, the main line 130 is provided near the chip end portion so as to ensure the distance from the sub line 140 at the portion where the terminal electrode pattern 126 is not present in the y-direction, that is, at the portion between the terminal electrode patterns 121 and 126 and the portion between the terminal electrode patterns 122 and 126. On the other hand, the main line 130 is laid out so as to meander to the sub line 140 side to avoid interference with the terminal electrode pattern 126 at the portion where the terminal electrode pattern 126 is present in the y-direction.

The sub line 140 includes a straight part 141 extending in the x-direction near the main line 130 and two planar spiral-shaped coil patterns 142 and 143. The coil patterns 142 and 143 are inductance patterns each used for obtaining an inductance component. The straight part 141 partially runs in parallel to a meandering part 131 of the main line 130 that meanders to the sub line 140 side, whereby the they are electromagnetically coupled; however, the parallel-running distance therebetween is short, and thus the electromagnetic coupling therebetween is comparatively weak. One end of the straight part 141 is connected to the terminal electrode pattern 123 corresponding to the coupling terminal, and the other end thereof is connected to the outer peripheral end of the coil pattern 142.

As illustrated in FIG. 4, a pad 142a is provided at the inner peripheral end of the coil pattern 142, and a pad 142b is provided at the outer peripheral end thereof. Similarly, a pad 143a is provided at the inner peripheral end of the coil pattern 143, and two pads $143b_1$ and $143b_2$ are provided at the outer peripheral end thereof. The above pads have a larger area than other conductor part for connecting to the conductor layer M2 arranged immediately thereabove.

The capacitor electrode patterns 151 and 152 are connected to the terminal electrode pattern 125 corresponding to the ground terminal. The capacitor electrode pattern 151 is positioned between the terminal electrode patterns 124 and 125, and the capacitor electrode pattern 152 is positioned between the terminal electrode patterns 123 and 125.

Figure 5:
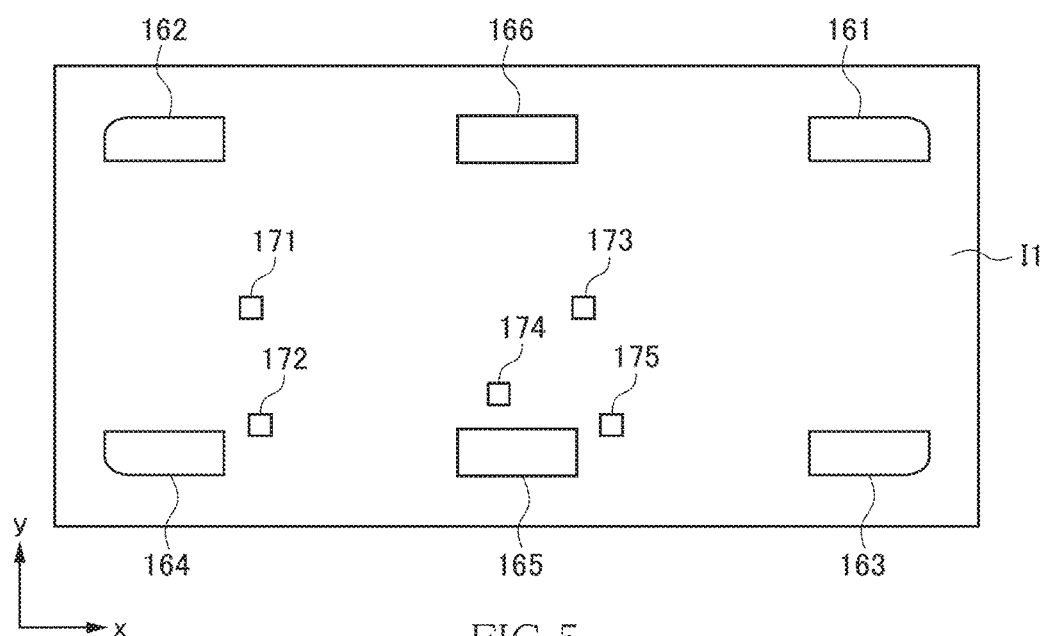
FIG. 5 is a plan view illustrating the configuration of an insulating layer.

The conductor layer M1 is covered with the insulating layer I1 illustrated in FIG. 5. The insulating layer I1 is made of an insulating material such as resin and has opening patterns 161 to 166 and 171 to 175. The insulating layers I2 to I4 are each also made of an insulating material such as resin. The opening patterns 161 to 166 are formed so as to expose the terminal electrode patterns 121 to 126, respectively, and the opening patterns 171 to 175 are formed so as to expose the pads 142a, 142b, 143a, $143b_1$, and $143b_2$, respectively.

Figure 6:
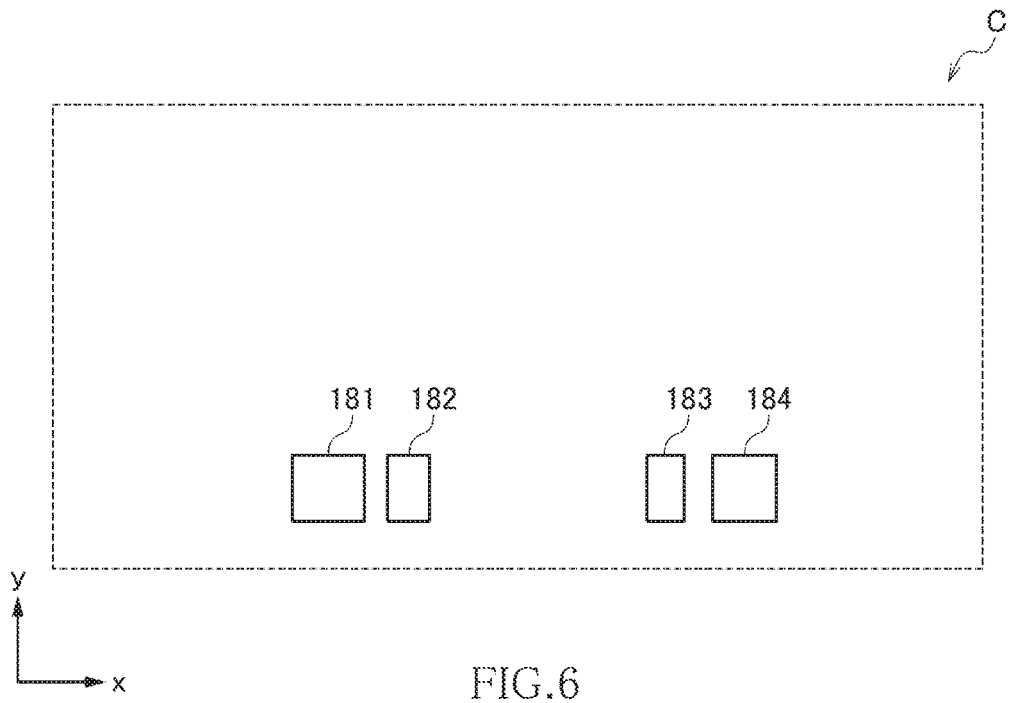
FIG. 6 is a plan view illustrating the configuration of a capacitor electrode layer.

The capacitor electrode layer C illustrated in FIG. 6 is provided on the insulating layer I1. The capacitor electrode layer C includes capacitor electrode patterns 181 to 184. The capacitor electrode patterns 181 and 182 are provided so as to overlap the capacitor electrode pattern 151 in a plan view, and the capacitor electrode patterns 183 and 184 are provided so as to overlap the capacitor electrode pattern 152. Thus, four capacitors are formed with the capacitor electrode patterns 181 to 184 used as electrodes on one side and capacitor electrode patterns 151 and 152 used as electrodes on the other side. Four capacitors include a capacitor having the capacitor electrode patterns 181 and 151; a capacitor having the capacitor electrode patterns 182 and 151; a capacitor having the capacitor electrode patterns 183 and 152; and a capacitor having the capacitor electrode patterns 184 and 152.

Figure 7:
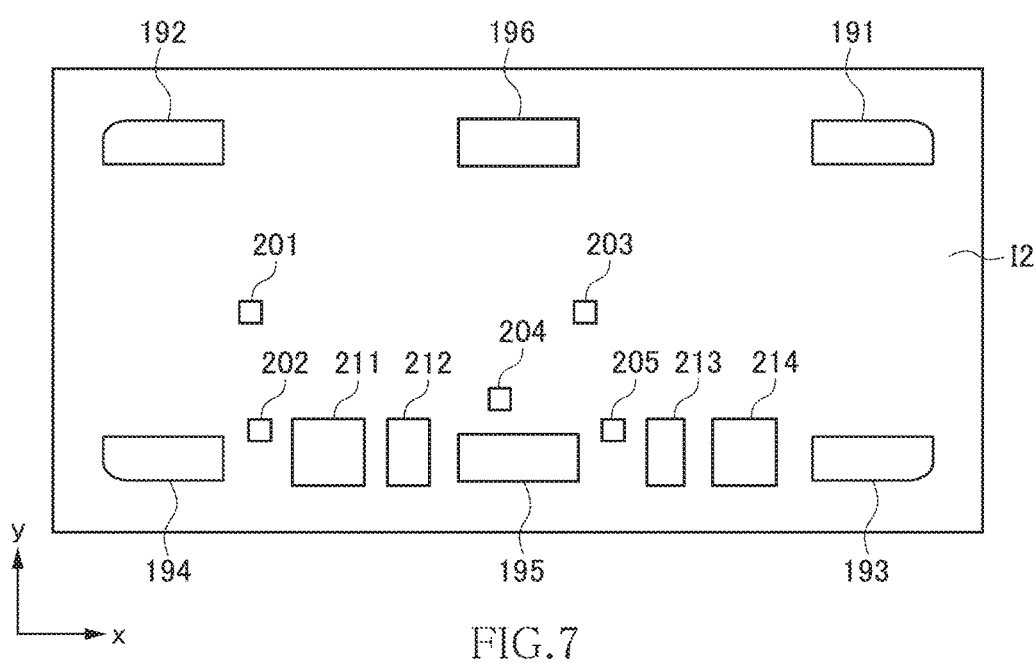
FIG. 7 is a plan view illustrating the configuration of another insulating layer.

The capacitor electrode layer C is covered with the insulating layer I2 illustrated in FIG. 7. The insulating layer I2 has opening patterns 191 to 196, 201 to 205, and 211 to 214. The opening patterns 191 to 196 are formed so as to expose the terminal electrode patterns 121 to 126, respectively, the opening patterns 201 to 205 are formed so as to expose the pads 142a, 142b, 143a, $143b_1$, and $143b_2$, respectively, and the opening patterns 211 to 214 are formed so as to expose the capacitor electrode patterns 181 to 184, respectively.

Figure 8:
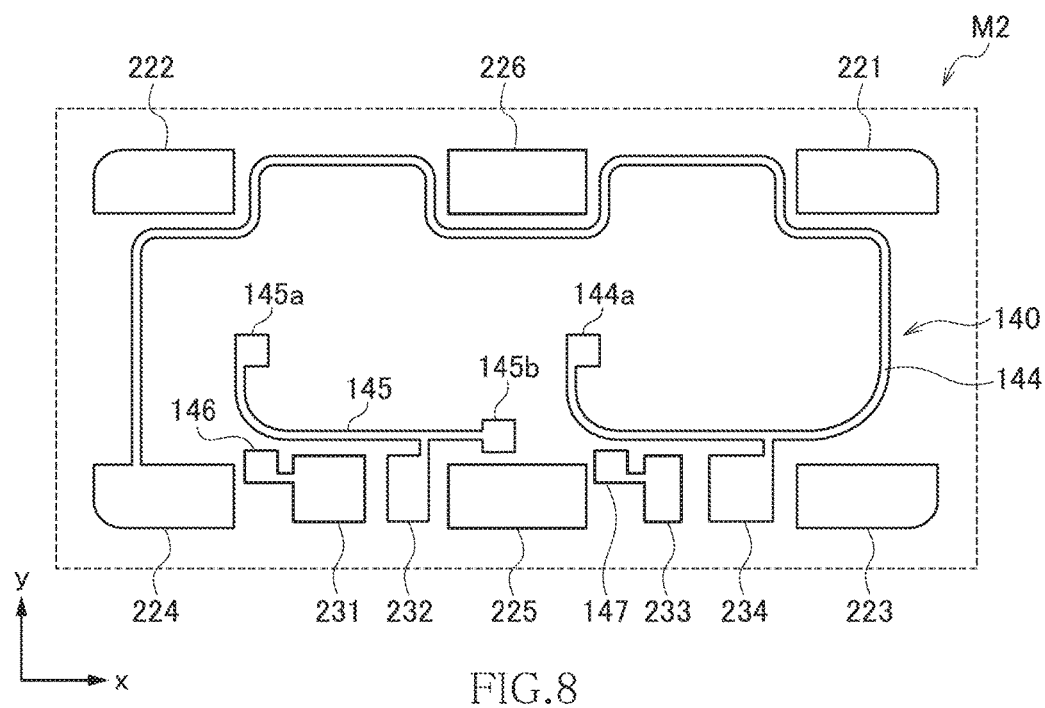
FIG. 8 is a plan view illustrating the configuration of another conductor layer.

The conductor layer M2 illustrated in FIG. 8 is provided on the insulating layer I2. The conductor layer M2 includes terminal electrode patterns 221 to 226, the other part of the sub line 140, and capacitor electrode patterns 231 to 234. The terminal electrode patterns 221 to 226 are connected respectively to the terminal electrode patterns 121 to 126 through the respective opening patterns 191 to 196 and 161 to 166.

The sub line 140 includes connecting parts 144 and 145 and pads 146 and 147. The connecting part 144 has a part that meanders along the main line 130 in a plan view. A pad 144a at one end of the connecting part 144 is connected to the pad 143a through the opening patterns 203 and 173, and the other end of the connecting part 144 is connected to the terminal electrode pattern 224. A part of the connecting part 144 that meanders along the main line 130 overlaps the main line 130 in a plan view, whereby they are electromagnetically coupled. The parallel-running distance between the part of the connecting part 144 and the main line 130 is long, and thus the electromagnetic coupling therebetween is comparatively strong. The connecting part 144 is also connected to the capacitor electrode pattern 234.

A pad 145a at one end of the connecting part 145 is connected to the pad 142a through the opening patterns 201 and 171, and a pad 145b at the other end of the connecting part 145 is connected to the pad 143b₁ through the opening patterns 204 and 174. The connecting part 145 is also connected to the capacitor electrode pattern 232.

The pad 146 is connected to the pad 142b through the opening patterns 202 and 172 and further to the capacitor electrode pattern 231. The pad 147 is connected to the pad 143b₂ through the opening patterns 205 and 175 and further to the capacitor electrode pattern 233. The capacitor electrode patterns 231 to 234 are connected respectively to the capacitor electrode patterns 181 to 184 through the respective opening patterns 211 to 214.

Figure 9:
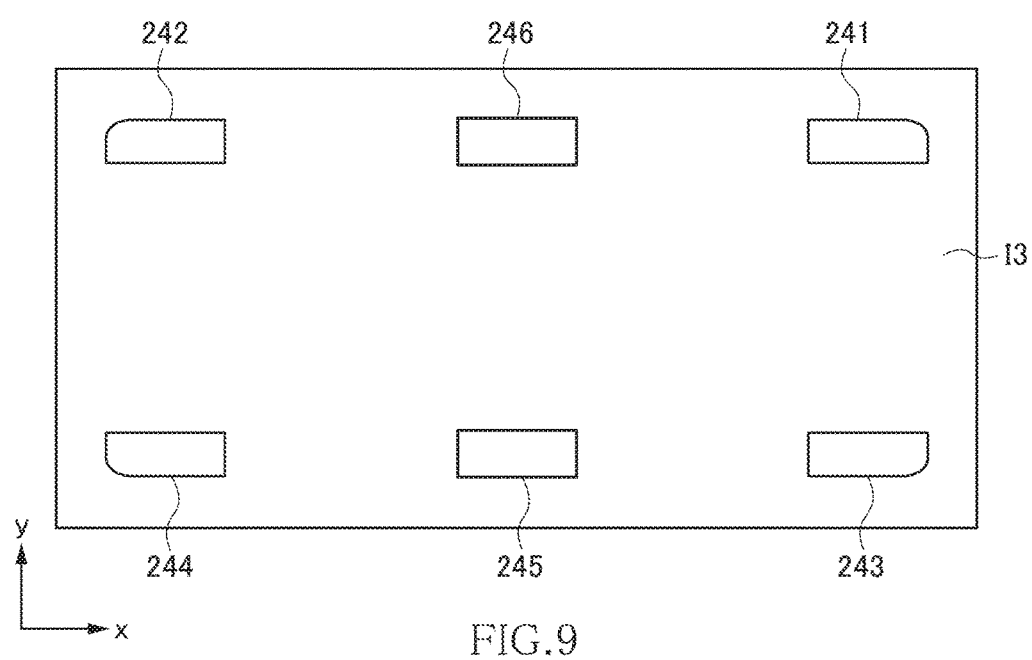
FIG. 9 is a plan view illustrating the configuration of still another insulating layer.

The conductor layer M2 is covered with the insulating layer I3 illustrated in FIG. 9. The insulating layer I3 has opening patterns 241 to 246. The opening patterns 241 to 246 are formed so as to expose the terminal electrode patterns 221 to 226.

Figure 10:
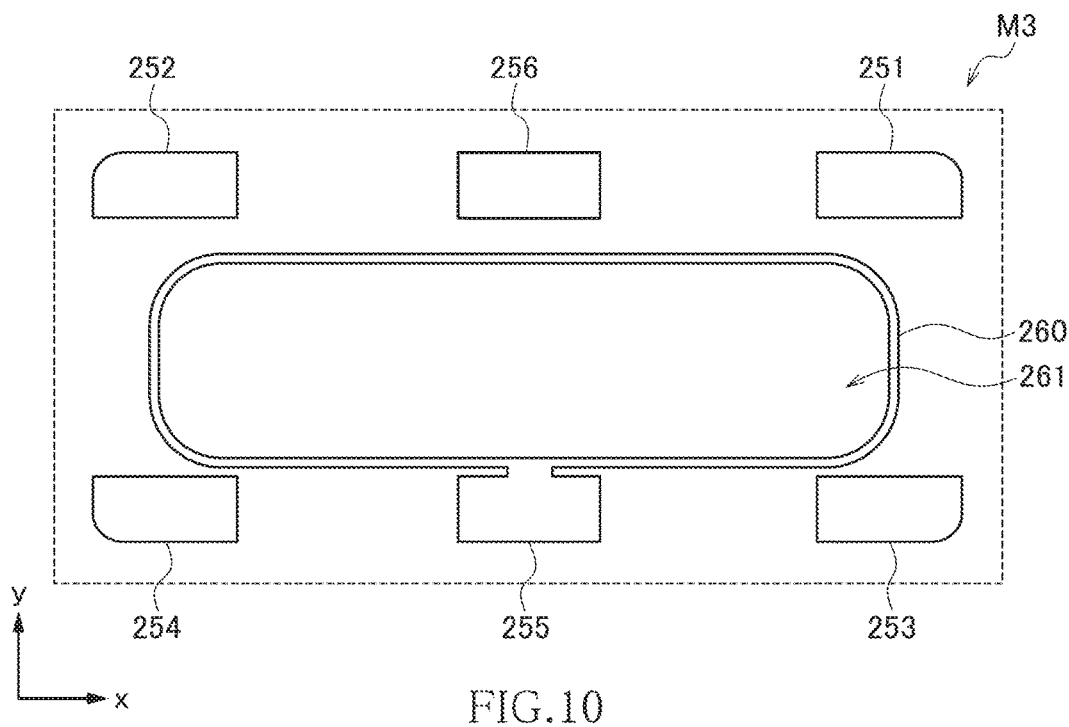
FIG. 10 is a plan view illustrating the configuration of still another conductor layer.

The conductor layer M3 illustrated in FIG. 10 is provided on the insulating layer I3. The conductor layer M3 includes terminal electrode patterns 251 to 256 and a loop-shaped ground pattern 260. The terminal electrode patterns 251 to 256 are connected respectively to the terminal electrode patterns 221 to 226 through the respective opening patterns 241 to 246.

The ground pattern 260 is connected to the terminal electrode pattern 255 corresponding to the ground terminal and has a large area opening 261 at its center portion. The "opening" mentioned here refers to a part where the ground pattern is removed and whose outer periphery is closed. That is, the ground pattern 260 has a loop shape and has a pattern width as small as the pattern width of each of the coil patterns 142 and 143. The ground pattern 260 is provided between the main line 130 and the sub line 140 in a plan view and thereby plays a role of preventing unnecessary interference between the main line 130 and the sub line 140.

The opening 261 of the ground pattern 260 is formed so as to overlap both the coil patterns 142 and 143 in a plan view. The opening 261 preferably completely accommodates both the coil patterns 142 and 143 in a plan view in terms of characteristics; however, it is necessary to increase the size of the loop shape of the ground pattern 260 in order to completely avoid overlap between the ground pattern 260 and the coil patterns 142, 143, which disadvantageously increases the chip size. Thus, in the present embodiment, the ground pattern 260 overlaps the outermost periphery of each of the coil patterns 142 and 143. With this configuration, in the present embodiment, the overlap between the coil patterns 142, 143 and the ground pattern 260 is minimized without increase in the chip size.

The area of the opening 261 is preferably made large. More preferably, the inner diameter part of each of the coil patterns 142 and 143 overlaps the opening 261. This is because the inner diameter part of each of the coil patterns 142 and 143 is a part with the highest magnetic flux density. That is, forming the opening 261 so as to overlap this part in a plan view can prevent reduction in the inductance of each of the coil patterns 142 and 143.

Figure 11:
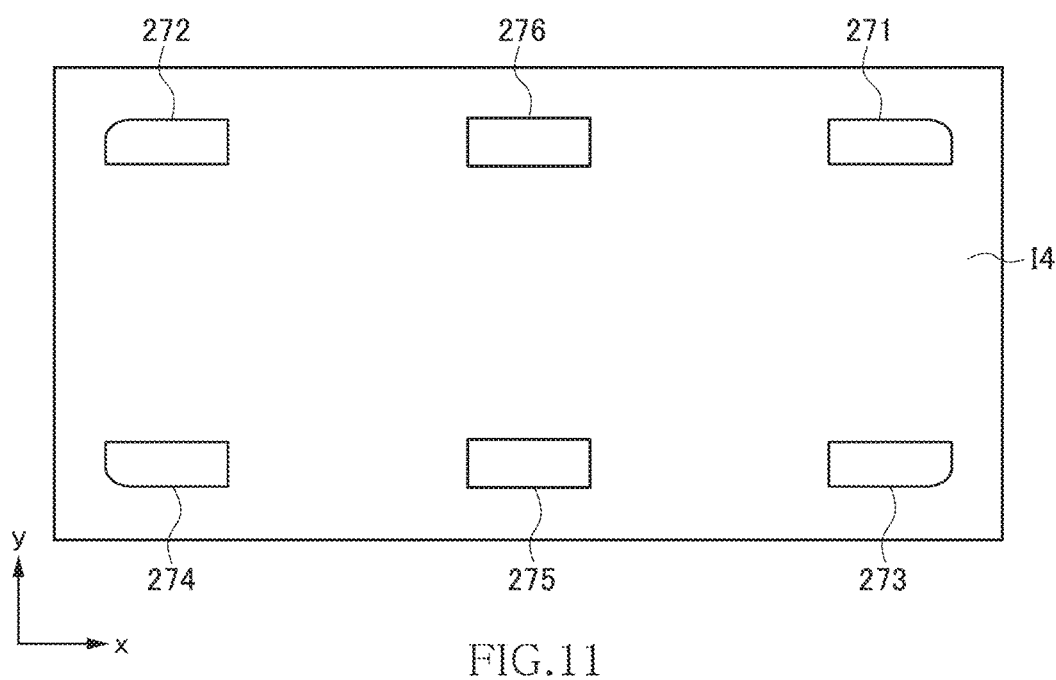
FIG. 11 is a plan view illustrating the configuration of still another insulating layer.

The conductor layer M3 is covered with the insulating layer I4 illustrated in FIG. 11. The insulating layer I4 has opening patterns 271 to 276. The opening patterns 271 to 276 are formed so as to expose the terminal electrode patterns 251 to 256, respectively.

Figure 12:
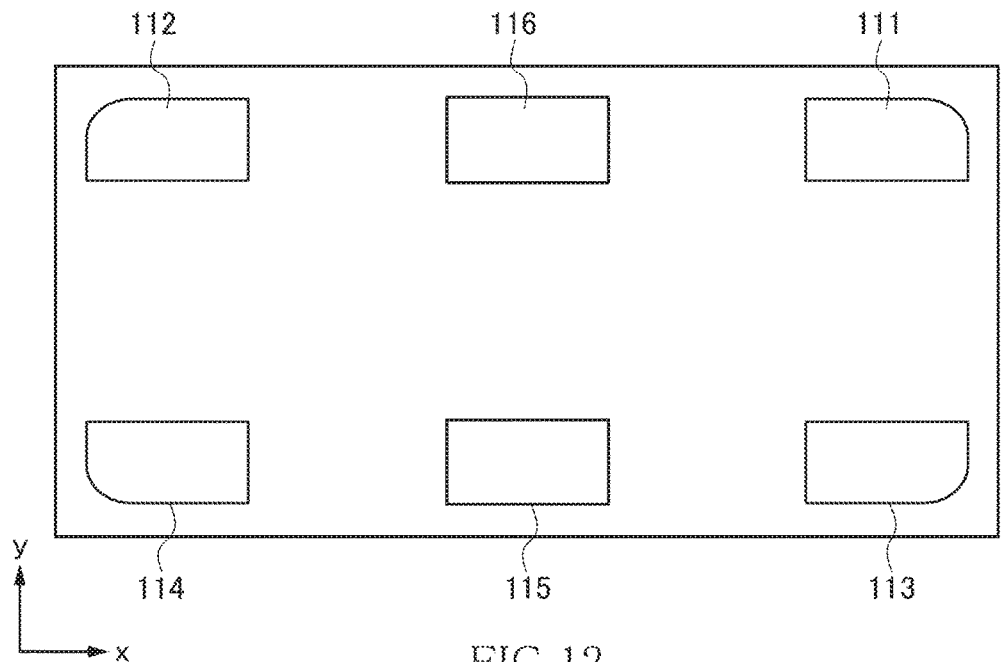
FIG. 12 is a plan view illustrating the configuration of terminal electrodes.

The terminal electrodes 111 to 116 illustrated in FIG. 12 are formed on the insulating layer I4. The terminal electrodes 111 to 116 are each also made of a good conductor such as copper (Cu) and connected respectively to the terminal electrode patterns 251 to 256 through the respective opening patterns 271 to 276.

Figure 13:
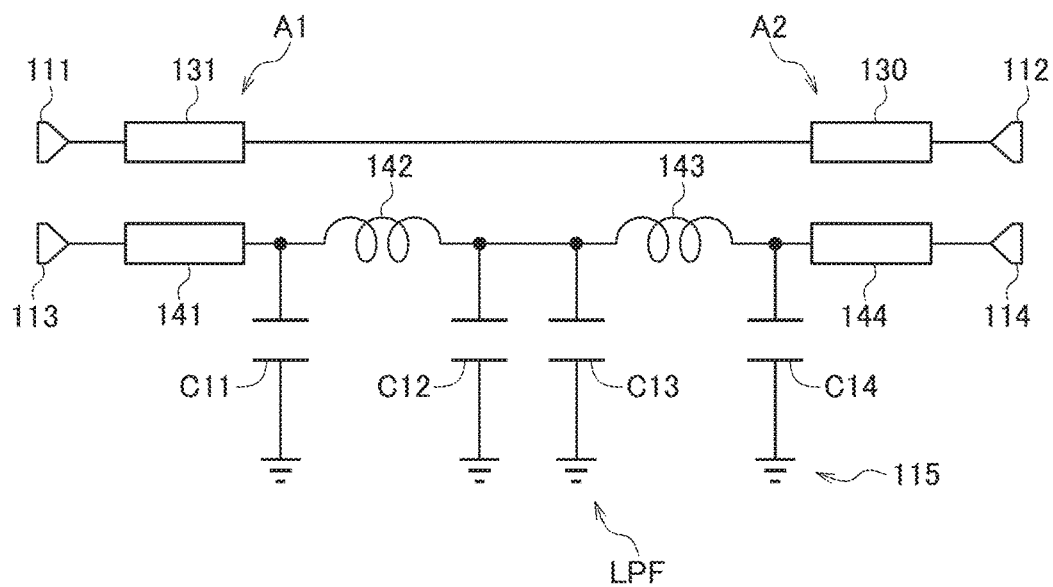
FIG. 13 is an equivalent circuit diagram of the directional coupler according to the first embodiment of the present invention.

FIG. 13 is an equivalent circuit diagram of the directional coupler 100 according to the present embodiment.

In the directional coupler 100 according to the present embodiment, a high-frequency transmission signal is input to the terminal electrode 111 and output from the terminal electrode 112. The terminal electrode 111 and terminal electrode 112 are connected to each other through the main line 130. The main line 130 is electromagnetically coupled to the sub line 140 at two sites. A coupling part A1 corresponds to electromagnetic coupling between the meandering part 131 of the main line 130 that meanders to the sub line 140 side and the straight part 141 of the sub line 140. A coupling part A2 corresponds to electromagnetic coupling between the whole main line 130 and the connecting part 144 of the sub line 140.

The two coil patterns 142 and 143 are connected in series between the straight part 141 and the connecting part 144 of the sub line 140. In the present embodiment, while the number of turns of each of the coil patterns 142 and 143 is about four, the coil pattern 143 is larger in diameter than the coil pattern 142, so that the coil patterns 142 and 143 generate their individual predetermined inductances.

Capacitors C11 and C12 are connected respectively to the both ends of the coil pattern 142. The capacitor C11 is constituted of the capacitor electrode patterns 151 and 181, and the capacitor C12 is constituted of the capacitor electrode patterns 151 and 182. Similarly, capacitors C13 and C14 are connected respectively to the both ends of the coil pattern 143. The capacitor C13 is constituted of the capacitor electrode patterns 152 and 183, and the capacitor C14 is constituted of the capacitor electrode patterns 152 and 184. The capacitor electrode patterns 181 to 184 have their individual predetermined planar sizes and thus generate their individual predetermined capacitances.

With the configuration described above, the coil patterns 142, 143 and capacitors C11 to C14 function as a low-pass filter LPF. The inductances of the respective coil patterns 142 and 143 and the capacitances of the respective capacitors C11 to C14 are designed so as to allow the low-pass filter LPF to exhibit desired frequency characteristics. It is therefore possible to extract a part of electric power of the transmission signal from the terminal electrode 113 as a coupling terminal in a wide frequency band.

Figure 14:
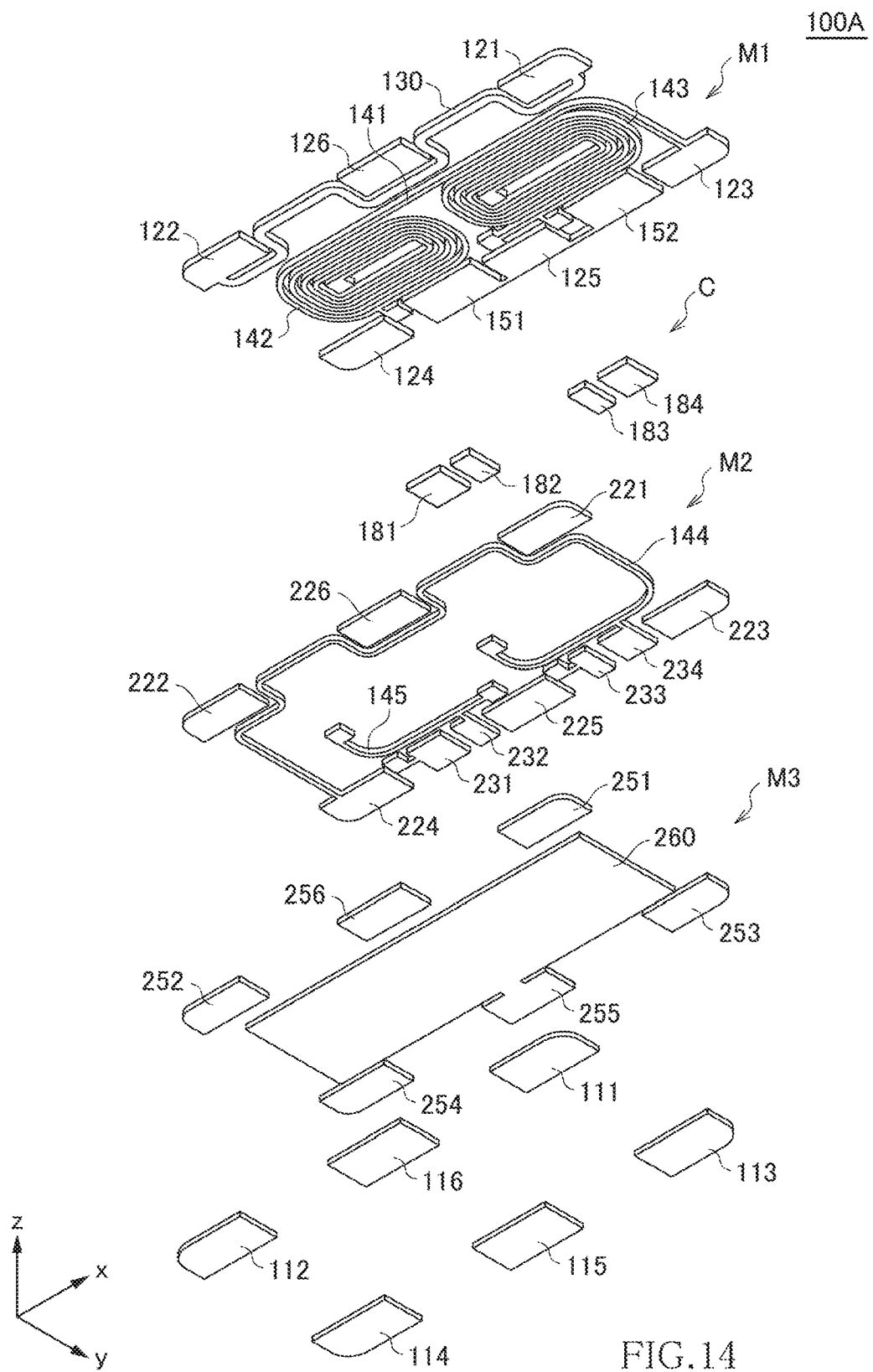
FIG. 14 is an exploded perspective view of a directional coupler according to a first comparative example.

FIG. 14 is an exploded perspective view of a directional coupler 100A according to a first comparative example.

The directional coupler 100A illustrated in FIG. 14 differs from the directional coupler 100 according to the above first embodiment in that the ground pattern 260 does not have a loop shape but has a large area pattern (solid pattern) that covers almost completely the coil patterns 142 and 143. Other configurations are the same as those of the directional coupler 100 according to the first embodiment, so the same reference numerals are given to the same elements, and repetitive explanations will be omitted.

In the directional coupler 100A according to the first comparative example, the ground pattern 260 has a solid pattern, so that magnetic flux generated by the coil patterns 142 and 143 is shielded by the solid pattern, resulting in reduction in inductance. Therefore, the number of turns of each of the coil patterns 142 and 143 needs to be increased in order to obtain a required inductance, which may lead to increase in the chip size. Further, overlap between the coil patterns 142, 143 and the ground pattern 260 increases loss of the sub line 140. Further, a large capacitance component is generated between the coil patterns 142, 143 and the ground pattern 260, so that when a variation in the film thickness occurs between the insulating layers I1 to I3 separating the coil patterns 142, 143 and the ground pattern 260, a capacitance component generated significantly varies, with the result that the frequency characteristics of the low-pass filter LPF significantly affected.

On the other hand, in the directional coupler 100 according to the first embodiment, the ground pattern 260 has a loop shape and thus hardly overlaps the coil patterns 142 and 143, which can therefore solve the above problem.

Figure 15A:
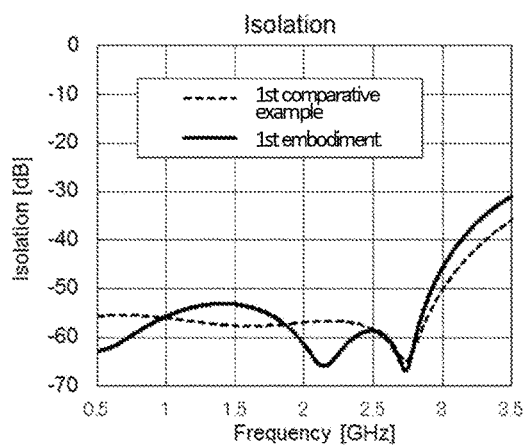
FIGS. 15A to 15D illustrate frequency characteristics of the directional couplers according to the first embodiment and the first comparative example, where
Figure 15B:
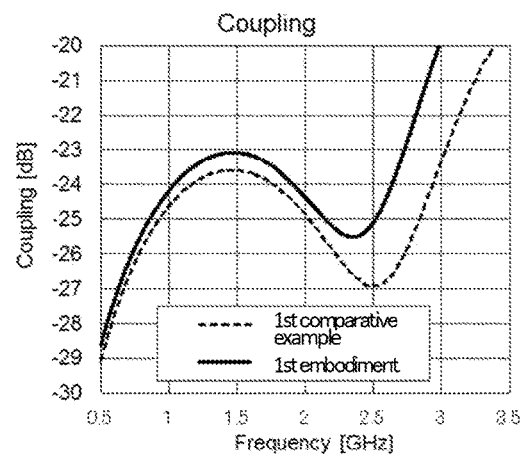
Figure 15C:
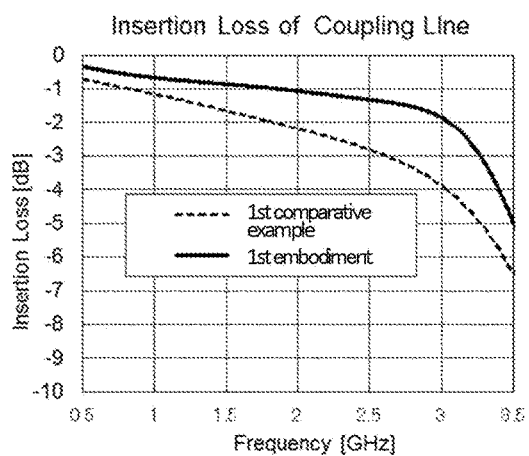
Figure 15D:
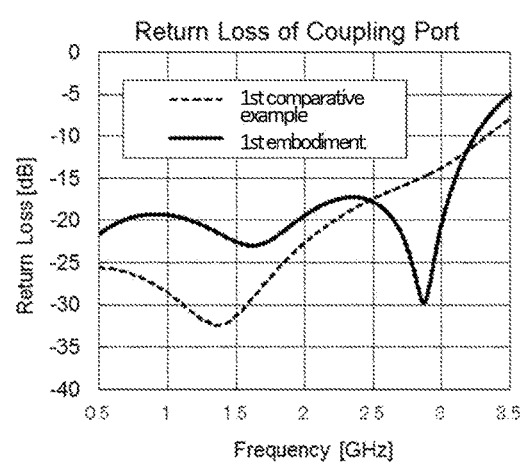

FIGS. 15A to 15D are graphs each illustrating the frequency characteristics of the directional coupler 100 according to the first embodiment and those of the directional coupler 100A according to the first comparative example. FIG. 15A illustrates isolation characteristics, FIG. 15B illustrates coupling characteristics, FIG. 15C illustrates insertion loss of the sub line, and FIG. 15D illustrates return loss of the coupling port.

The directional coupler 100 and directional coupler 100A are almost equivalent in terms of isolation characteristics and return loss illustrated in FIGS. 15A and 15D. That is, unnecessary interference between the main line 130 and the sub line 140 can be prevented sufficiently irrespective of whether the ground pattern 260 has a solid pattern or a loop shape. This is because the function of preventing interference between the main line 130 and the sub line 140 is mainly provided by the outer peripheral part of the ground pattern 260.

Regarding the coupling characteristics illustrated in FIG. 15B, since the directional coupler 100 according to the first embodiment obtains a larger inductance, the peak point shifts to a low frequency side, with the result that coupling is achieved in a wider frequency band. Regarding insertion loss illustrated in FIG. 15C as well, the directional coupler 100 according to the first embodiment has lower loss.

As described above, in the directional coupler 100 according to the present embodiment, the ground pattern 260 has a loop shape and thus hardly overlaps the coil patterns 142 and 143, so that magnetic flux generated by the coil patterns 142 and 143 is not shielded, with the result that a larger inductance can be obtained. Thus, the number of turns of each of the coil patterns 142 and 143 required to obtain a predetermined inductance is reduced, thereby allowing reduction in the chip size. Further, the coil patterns 142, 143 and the ground pattern 260 hardly overlap each other, so that loss of the sub line 140 can be reduced. Furthermore, the capacitance component between the coil patterns 142, 143 and the ground pattern 260 is very small, so that even when a variation in the film thickness occurs between the insulating layers I1 to I3 according to manufacturing conditions, influence on the frequency characteristics of the low-pass filter LPF can be reduced.

Second Embodiment

Figure 16:
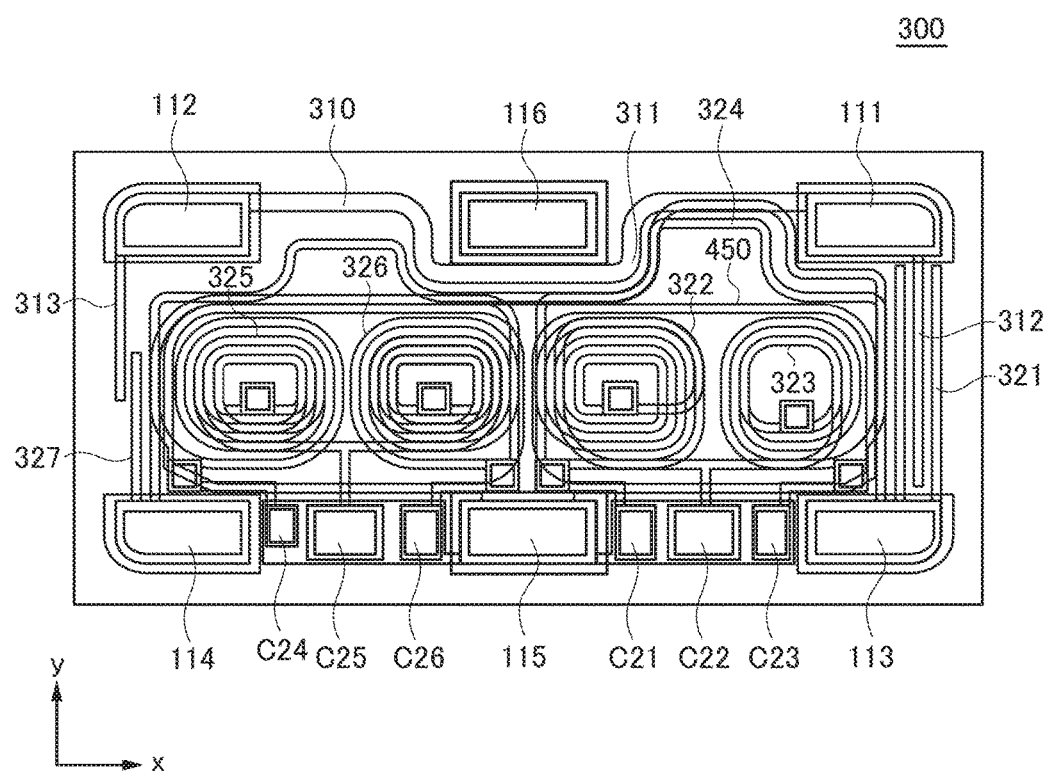
FIG. 16 is a see-through view for explaining the structure of a directional coupler according to a second embodiment of the present invention.

FIG. 16 is a view for explaining the structure of a directional coupler 300 according to a second embodiment of the present invention and is a see-through view of a conductor layer included in the laminated structure 102 as viewed in the lamination direction (z-direction). FIGS. 17 to 24 are plan views each illustrating the configuration of each layer constituting the laminated structure 102. The directional coupler 300 according to the second embodiment has the same outer appearance as that of the directional coupler 100 of FIG. 1 according to the first embodiment and has the terminal electrodes 111 to 116 on its bottom surface.

As illustrated in FIGS. 16 to 24, like the first embodiment, the laminated structure 102 constituting the directional coupler 300 according to the present embodiment is constituted of the conductor layers M1 to M3, capacitor electrode layers C, and insulating layers I1 to I4 provided between the adjacent conductor layers or adjacent conductor and the capacitor electrode layers. Hereinafter, the configuration of each layer will be described in detail.

Figure 17:
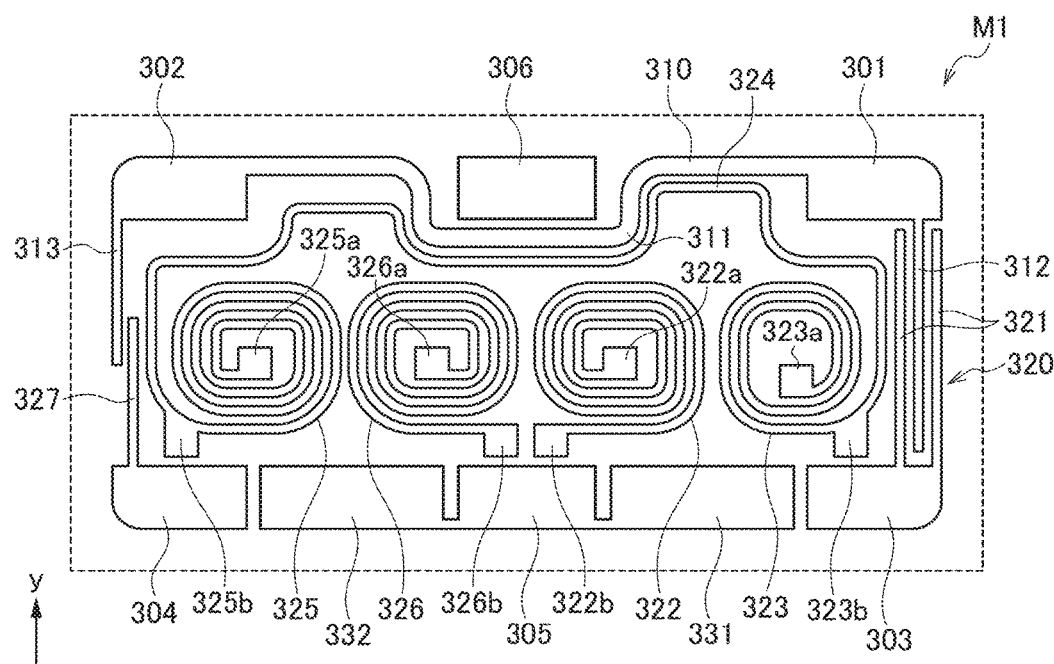
FIG. 17 is a plan view illustrating the configuration of a conductor layer.

The conductor layer M1 illustrated in FIG. 17 is provided in the lowermost layer of the laminated structure 102. The conductor layer M1 includes terminal electrode patterns 301 to 306, a main line 310, a sub line 320 (a part of the sub line that is formed on the conductor layer M1), and capacitor electrode patterns 331 and 332. The terminal electrode patterns 301 to 306 are connected respectively to the terminal electrodes 111 to 116 and disposed so as to overlap the terminal electrodes 111 to 116 in a plan view (as viewed in the z-direction).

The main line 310 is a conductor pattern connecting the terminal electrode 111 serving as an input terminal and the terminal electrode 112 serving as an output terminal and has a meandering part 311 laid out in a meandering fashion so as to avoid the terminal electrode pattern 306, a straight part 312 extending in the y-direction from the terminal electrode pattern 301 toward the terminal electrode pattern 303, and a straight part 313 extending in the y-direction from the terminal electrode pattern 302 toward the terminal electrode pattern 304.

The sub line 320 includes two straight parts 321 extending in the y-direction from the terminal electrode pattern 303 toward the terminal electrode pattern 301, four planar spiral-shaped coil patterns 322, 323, 325, and 326, a meandering part 324 connecting the coil patterns 323 and 325, and a straight part 327 extending in the y-direction from the terminal electrode pattern 304 toward the terminal electrode pattern 302. The two straight parts 321 are disposed so as to sandwich the straight part 312 constituting the main line 310, whereby they are electromagnetically coupled. A part of the straight part 327 runs in parallel to the straight part 313 constituting the main line 310, whereby they are electromagnetically coupled. Further, the meandering part 324 meanders while running in parallel to the meandering part 311 constituting the main line 310, whereby they are electromagnetically coupled.

The coil pattern 322 is wound by about three turns and has a pad 322a at the inner peripheral end thereof and a pad 322b at the outer peripheral end thereof. The coil pattern 323 is wound by about two turns and has a pad 323a at the inner peripheral end thereof and a pad 323b at the outer peripheral end thereof. The coil pattern 325 is wound by about three turns and has a pad 325a at the inner peripheral end thereof and a pad 325b at the outer peripheral end thereof. The coil pattern 326 is wound by about three turns and has a pad 326a at the inner peripheral end thereof and a pad 326b at the outer peripheral end thereof. The outer peripheral end of the coil pattern 323 and the outer peripheral end of the coil pattern 325 are connected to each other through the meandering part 324.

The capacitor electrode patterns 331 and 332 are connected to the terminal electrode pattern 305 corresponding to the ground terminal. The capacitor electrode pattern 331 is positioned between the terminal electrode patterns 303 and 305, and the capacitor electrode pattern 332 is positioned between the terminal electrode patterns 304 and 305.

Figure 18:
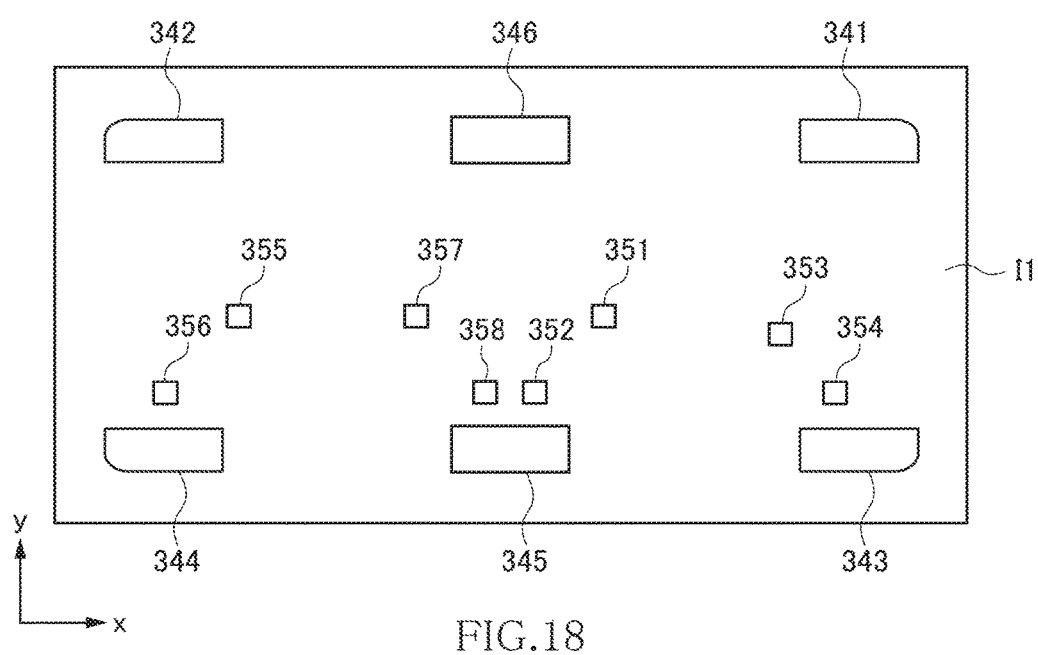
FIG. 18 is a plan view illustrating the configuration of an insulating layer.

The conductor layer M1 is covered with the insulating layer I1 illustrated in FIG. 18. The insulating layer I1 has opening patterns 341 to 346 and 351 to 358. The opening patterns 341 to 346 are formed so as to expose the terminal electrode patterns 301 to 306, respectively, and the opening patterns 351 to 358 are formed so as to expose the pads 322a, 322b, 323a, 323b, 325a, 325b, 326a, and 326b, respectively.

Figure 19:
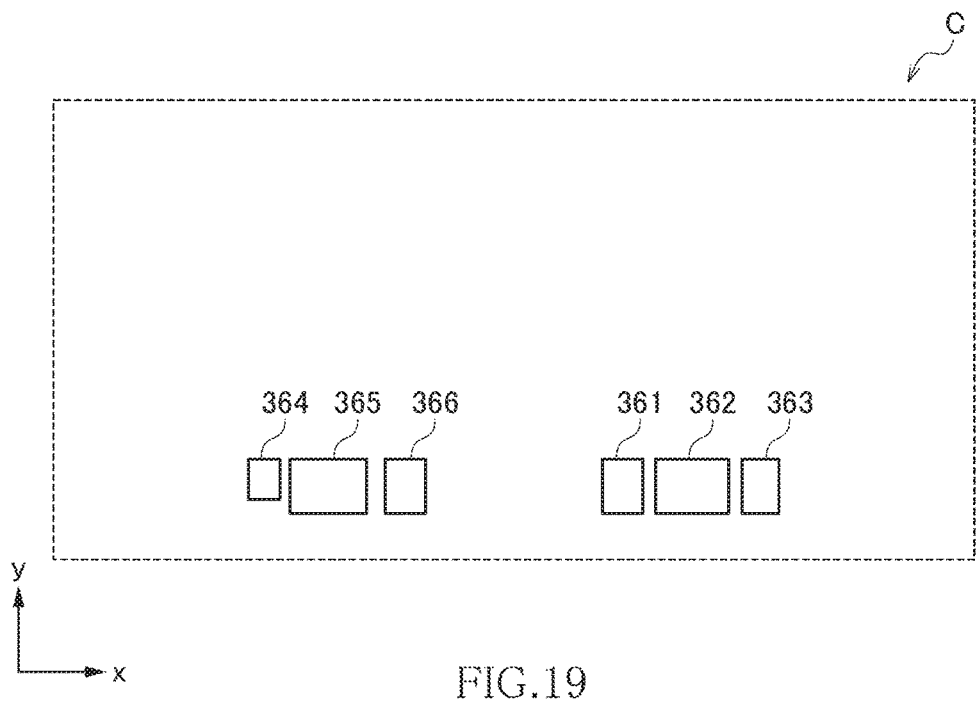
FIG. 19 is a plan view illustrating the configuration of a capacitor electrode layer.

The capacitor electrode layer C illustrated in FIG. 19 is provided on the insulating layer I1. The capacitor electrode layer C includes capacitor electrode patterns 361 to 366. The capacitor electrode patterns 361 to 363 are provided so as to overlap the capacitor electrode pattern 331 in a plan view, and the capacitor electrode patterns 364 to 366 are provided so as to overlap the capacitor electrode pattern 332. Thus, six capacitors are formed with the capacitor electrode patterns 361 to 366 used as electrodes on one side and capacitor electrode patterns 331 and 332 used as electrodes on the other side. Six capacitors include a capacitor having the capacitor electrode patterns 361 and 331; a capacitor having the capacitor electrode patterns 362 and 331; a capacitor having the capacitor electrode patterns 363 and 331; a capacitor having the capacitor electrode patterns 364 and 332; a capacitor having the capacitor electrode patterns 365 and 332; and a capacitor having the capacitor electrode patterns 366 and 332.

Figure 20:
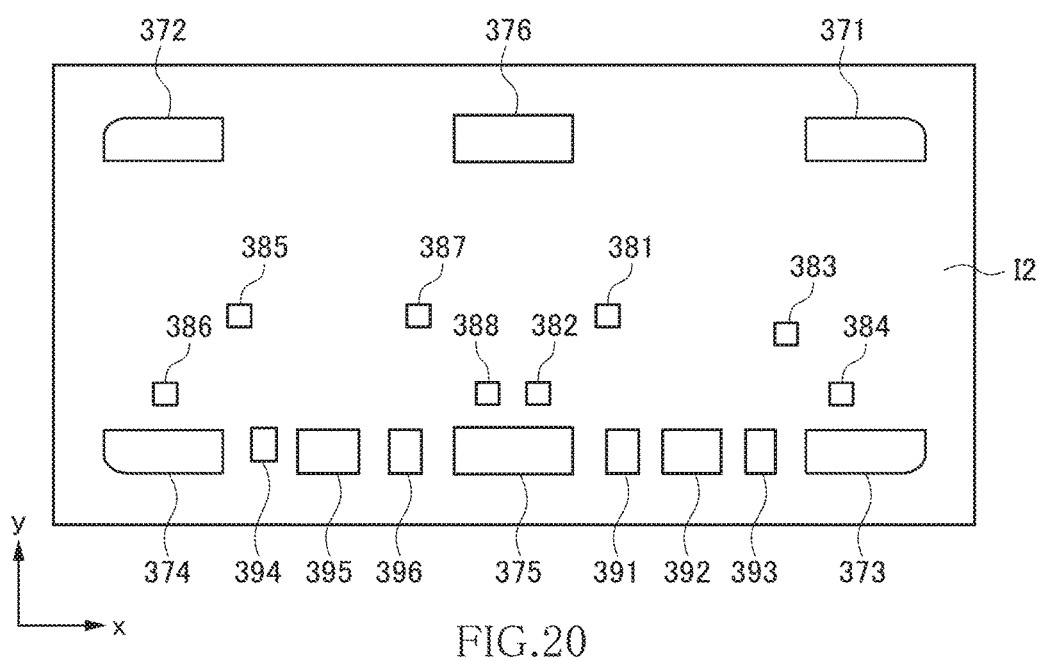
FIG. 20 is a plan view illustrating the configuration of another insulating layer.

The capacitor electrode layer C is covered with the insulating layer I2 illustrated in FIG. 20. The insulating layer I2 has opening patterns 371 to 376, 381 to 388, and 391 to 396. The opening patterns 371 to 376 are formed so as to expose the terminal electrode patterns 301 to 306, respectively, the opening patterns 381 to 388 are formed so as to expose the pads 322a, 322b, 323a, 323b, 325a, 325b, 326a, and 326b, respectively, and the opening patterns 391 to 396 are formed so as to expose the capacitor electrode patterns 361 to 366, respectively.

Figure 21:
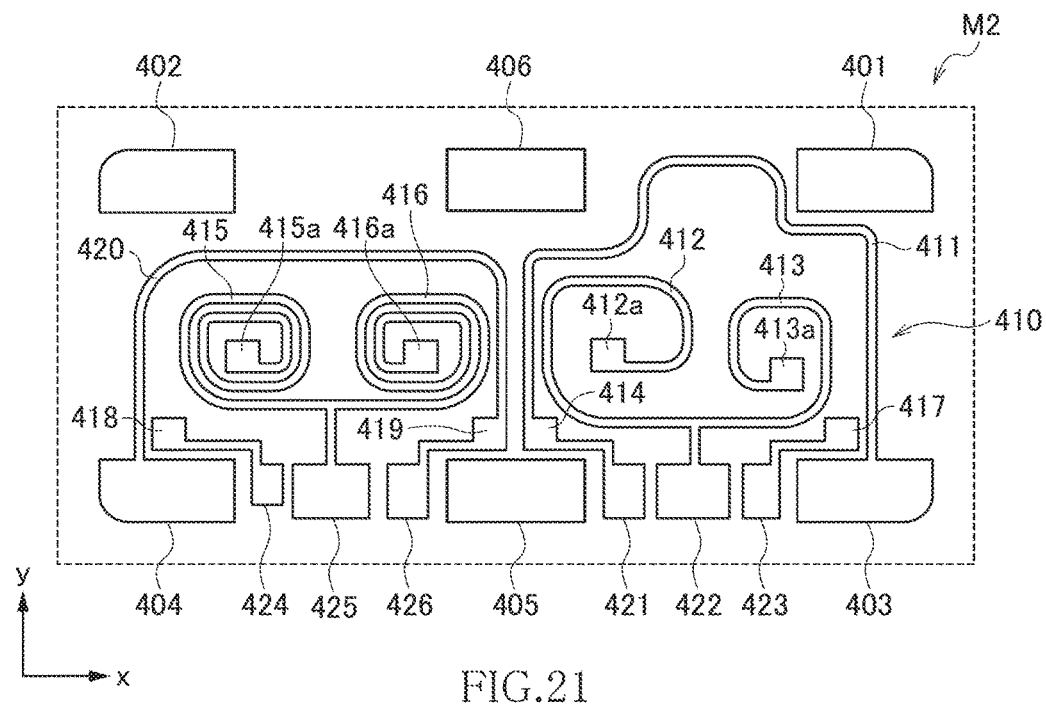
FIG. 21 is a plan view illustrating the configuration of another conductor layer.

The conductor layer M2 illustrated in FIG. 21 is provided on the insulating layer I2. The conductor layer M2 includes terminal electrode patterns 401 to 406, a sub line 410 (a part of the sub line that is formed on the conductor layer M2), and capacitor electrode patterns 421 to 426. The terminal electrode patterns 401 to 406 are connected respectively to the terminal electrode patterns 301 to 306 through the respective opening patterns 371 to 376 and 341 to 346.

The sub line 410 includes connecting parts 411 and 420, coil patterns 412, 413, 415, and 416, and pads 414 and 417 to 419. The connecting part 411 has a part that meanders while overlapping the main line 310 in a plan view. One end of the connecting part 411 is connected to the terminal electrode pattern 403, and the other end thereof is connected to the pad 414. The pad 414 is connected to the capacitor electrode pattern 421 and further to the pad 322b through the opening patterns 382 and 352. One end of the connecting part 420 is connected to the terminal electrode pattern 404, and the other end thereof is connected to the pad 419. The pad 419 is connected to the capacitor electrode pattern 426 and further to the pad 326b through the opening patterns 388 and 358.

Pads 412a, 413a, 415a, and 416a are provided at the inner peripheral ends of the respective coil patterns 412, 413, 415, and 416. The pad 412a is connected to the pad 322a through the opening patterns 381 and 351, the pad 413a is connected to the pad 323a through the opening patterns 383 and 353, the pad 415a is connected to the pad 325a through the opening patterns 385 and 355, and the pad 416a is connected to the pad 326a through the opening patterns 387 and 357.

The outer peripheral end of the coil pattern 412 and the outer peripheral end of the coil pattern 413 are each connected to the capacitor electrode pattern 422. Similarly, the outer peripheral end of the coil pattern 415 and the outer peripheral end of the coil pattern 416 are each connected to the capacitor electrode pattern 425. The pad 417 is connected to the capacitor electrode pattern 423 and further to the pad 323b through the opening patterns 384 and 354. Similarly, the pad 418 is connected to the capacitor electrode pattern 424 and further to the pad 325b through the opening patterns 386 and 356. The capacitor electrode patterns 421 to 426 are connected respectively to the capacitor electrode patterns 364 to 366 through the respective opening patterns 391 to 396.

Figure 22:
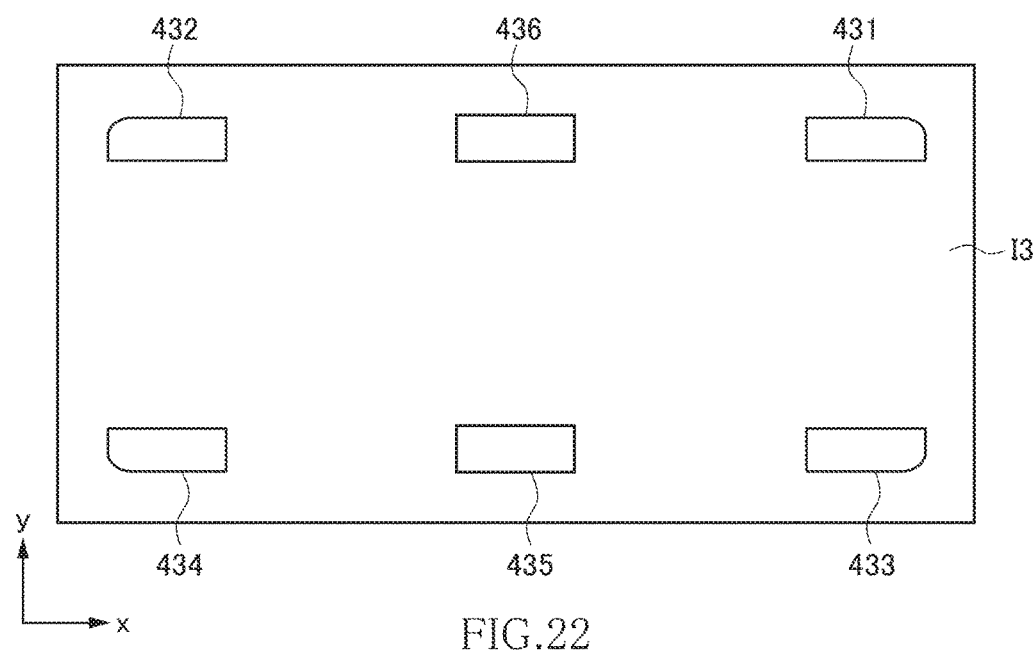
FIG. 22 is a plan view illustrating the configuration of still another insulating layer.

The conductor layer M2 is covered with the insulating layer I3 illustrated in FIG. 22. The insulating layer I3 has opening patterns 431 to 436. The opening patterns 431 to 436 are formed so as to expose the terminal electrode patterns 401 to 406.

Figure 23:
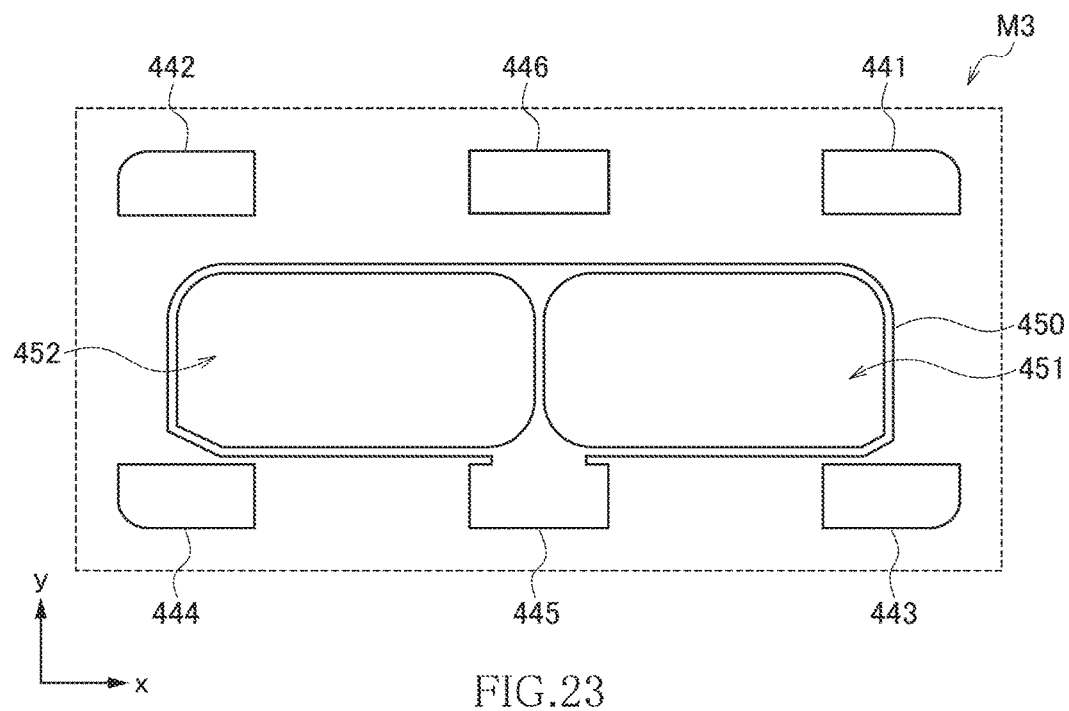
FIG. 23 is a plan view illustrating the configuration of still another conductor layer.

The conductor layer M3 illustrated in FIG. 23 is provided on the insulating layer I3. The conductor layer M3 includes terminal electrode patterns 441 to 446 and a ground pattern 450 having two loops. The terminal electrode patterns 441 to 446 are connected respectively to the terminal electrode patterns 401 to 406 through the respective opening patterns 431 to 436.

The ground pattern 450 is connected to the terminal electrode pattern 455 corresponding to the ground terminal and has an opening 451 formed so as to overlap the coil patterns 322, 323, 412, and 413 in a plan view and an opening 452 formed so as to overlap the coil patterns 325, 326, 415, and 416 in a plan view. As a result, the ground pattern 450 has a shape in which two loops are connected. The ground pattern 450 is provided between the main line 310 and the sub lines 320 and 410 in a plan view and thereby plays a role of preventing unnecessary interference between the main line 130 and the sub lines 320 and 410 like the ground pattern 260 of the first embodiment. The ground pattern 450 preferably does not overlap the coil patterns in a plan view in terms of characteristics; however, the ground pattern 450 may overlap only the outermost periphery of each coil pattern as in the case of the first embodiment.

In the present embodiment, it is not essential to form two openings 451 and 452, and a large opening may be formed in place of forming the two openings 451 and 452. However, in order to prevent interference between low-pass filters LP1 and LPF2 to be described later, it is preferable to form the two openings 451 and 452 as illustrated in FIG. 23.

Figure 24:
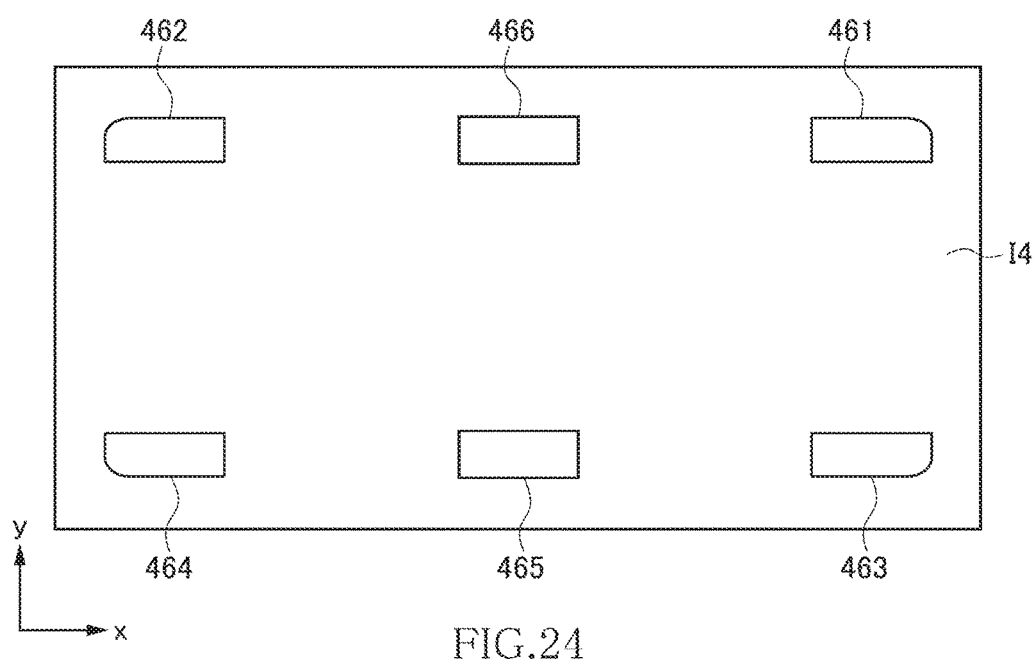
FIG. 24 is a plan view illustrating the configuration of still another insulating layer.

The conductor layer M3 is covered with the insulating layer I4 illustrated in FIG. 24. The insulating layer I4 has opening patterns 461 to 466. The opening patterns 461 to 466 are formed so as to expose the terminal electrode patterns 441 to 446, respectively.

The terminal electrodes 111 to 116 are formed on the insulating layer I4 as described using FIG. 12. The terminal electrodes 111 to 116 are connected respectively to the terminal electrode patterns 441 to 446 through the respective opening patterns 461 to 466.

Figure 25:
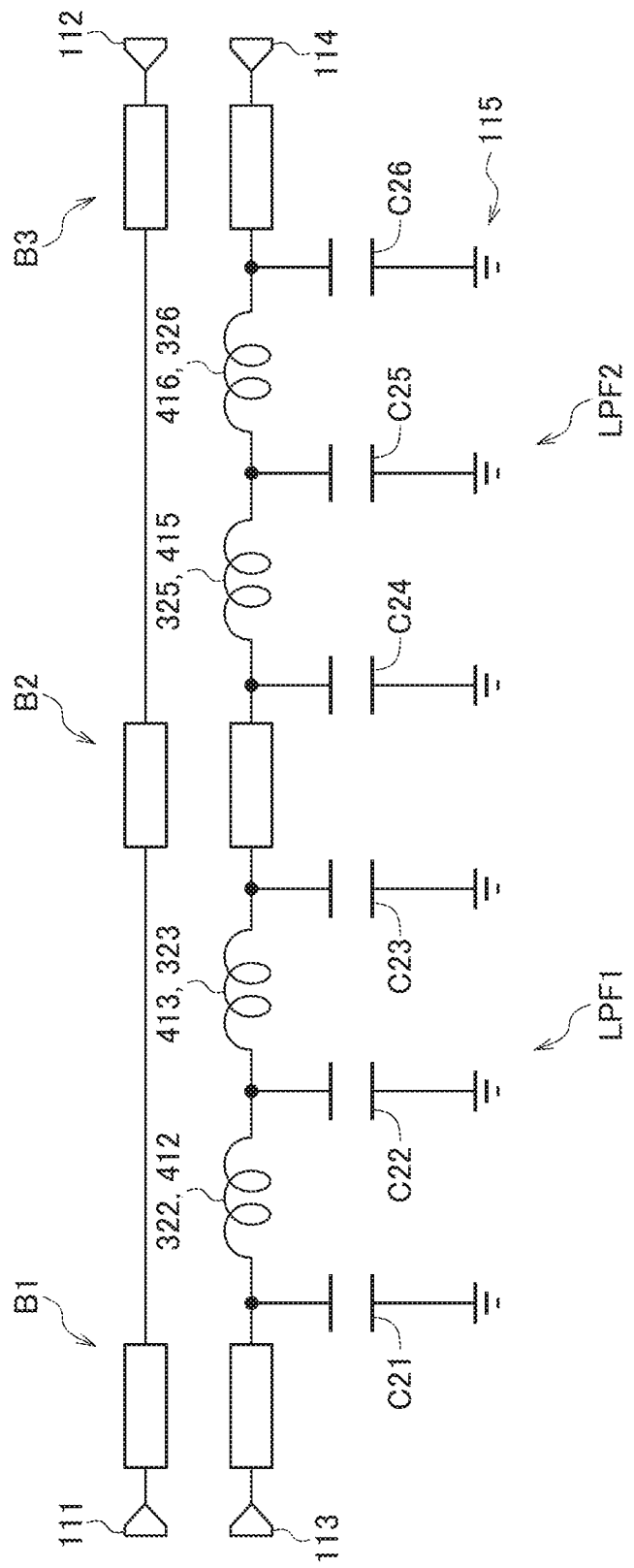
FIG. 25 is an equivalent circuit diagram of the directional coupler according to the second embodiment of the present invention.

FIG. 25 is an equivalent circuit diagram of the directional coupler 300 according to the present embodiment.

In the directional coupler 300 according to the present embodiment, the main line 310 is electromagnetically coupled to the sub lines 320 and 410 at three positions. A coupling part B1 corresponds to electromagnetic coupling at the portion where the straight part 312 of the main line 310 is sandwiched between the straight parts 321 of the sub line 320 and electromagnetic coupling at the portion where the meandering part 311 of the main line 310 and the connecting part 411 of the sub line 410 overlap each other in a plan view. A coupling part B2 corresponds to electromagnetic coupling at the portion where the meandering part 311 of the main line 310 and the meandering part 324 of the sub line 320 run in parallel to each other. A coupling part B3 corresponds to electromagnetic coupling at the portion where the straight part 313 of the main line 310 and the straight part 327 of the sub line 320 are adjacent to each other.

The coil patterns 322, 412, 413, and 323 are connected in series between the coupling parts B1 and B2. Capacitors C21 and C22 are connected respectively to the both ends of the coil pattern 322 and respectively to the both ends of the coil pattern 412. The capacitor C21 is constituted of the capacitor electrode patterns 331 and 361, and the capacitor C22 is constituted of the capacitor electrode patterns 331 and 362. The capacitor C22 and a capacitor C23 are connected respectively to the both ends of the coil pattern 413 and respectively to the both ends of the coil pattern 323. The capacitor C23 is constituted of the capacitor electrode patterns 331 and 363.

The coil patterns 325, 415, 416, and 326 are connected in series between the coupling parts B2 and B3. Capacitors C24 and C25 are connected respectively to the both ends of the coil pattern 325 and respectively to the both ends of the coil pattern 415. The capacitor C24 is constituted of the capacitor electrode patterns 332 and 364, and the capacitor C25 is constituted of the capacitor electrode patterns 332 and 365. The capacitor C25 and a capacitor C26 are connected respectively to the both ends of the coil pattern 416 and respectively to the both ends of the coil pattern 326. The capacitor C26 is constituted of the capacitor electrode patterns 332 and 366.

With the configuration described above, the coil patterns 322, 412, 413, and 323 and capacitors C21 to C23 function as a first low-pass filter LPF1, and the coil patterns 325, 415, 416, and 326 and capacitors C24 to C26 function as a second low-pass filter LPF2. The inductances of the respective coil patterns and the capacitances of the respective capacitors C21 to C26 are designed so as to allow the low-pass filters LPF1 and LPF2 to each exhibit desired frequency characteristics. As a result, it is possible to extract a part of electric power of the transmission signal from the terminal electrode 113 as a coupling terminal in a wider frequency band than in the first embodiment.

Figure 26:
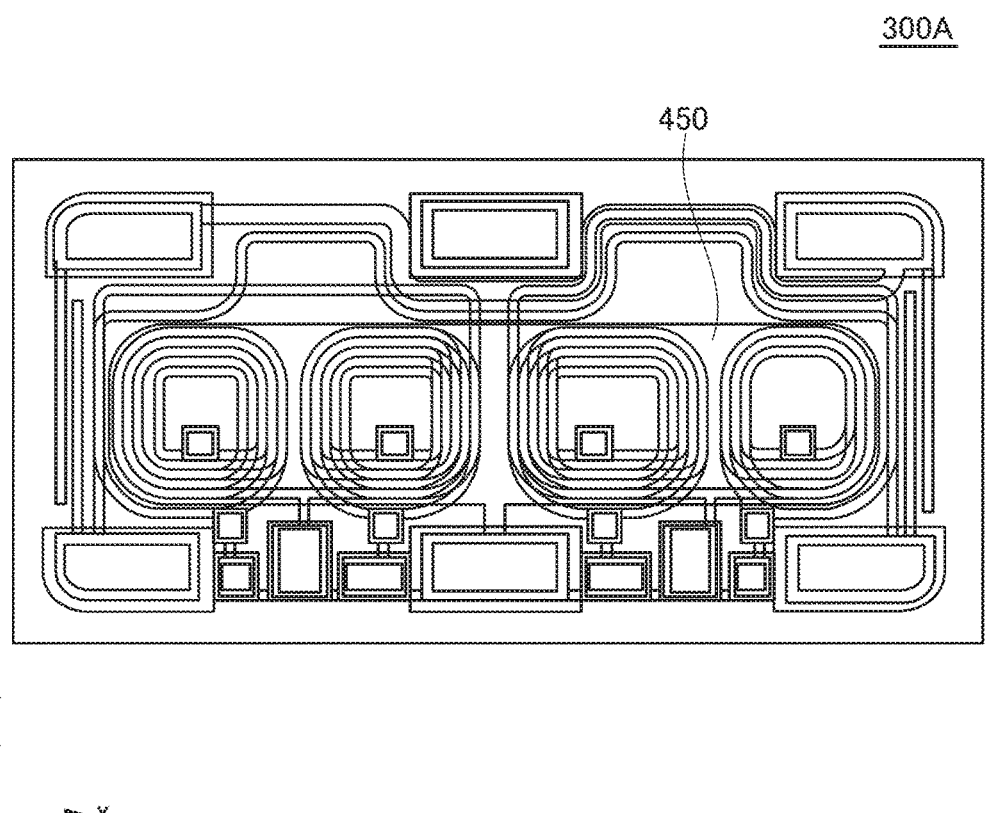
FIG. 26 is a see-through view for explaining the structure of a directional coupler according to a second comparative example.

FIG. 26 is a see-through view for explaining the structure of a directional coupler according to a second comparative example;

The directional coupler 300A illustrated in FIG. 26 differs from the directional coupler 300 according to the above second embodiment in that the ground pattern 450 does not have an opening but has a large area pattern (solid pattern) that covers almost completely the coil patterns. Other configurations are the same as those of the directional coupler 300 according to the second embodiment.

In the directional coupler 300A according to the second comparative example, the ground pattern 450 has a solid pattern, so that, as in the first comparative example, reduction in inductance, increase in loss of the sub line, a variation in frequency characteristics, and the like occur. On the other hand, in the directional coupler 300 according to the second embodiment, the ground pattern 450 has the openings 451 and 452 and thus hardly overlaps the coil patterns. So, the above problem can be solved.

Figure 27A:
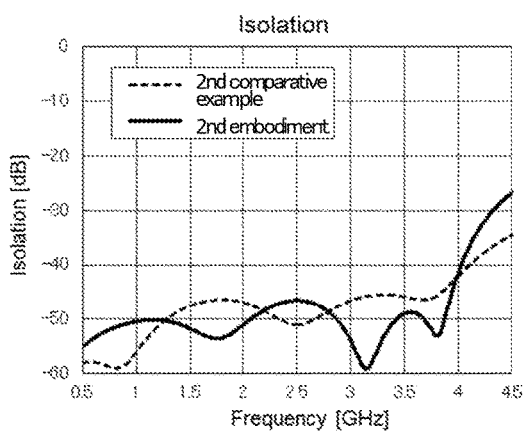
FIGS. 27A to 27D illustrate frequency characteristics of the directional couplers according to the second embodiment and the second comparative example, where
Figure 27B:
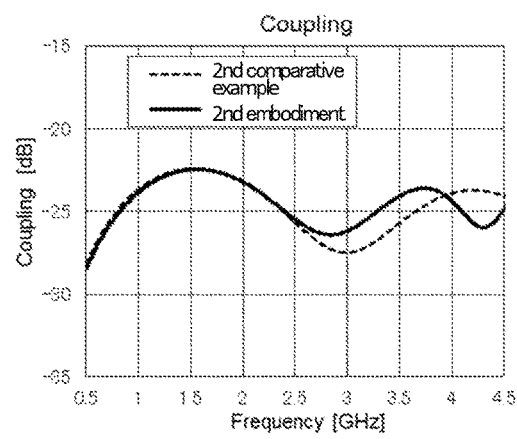
Figure 27C:
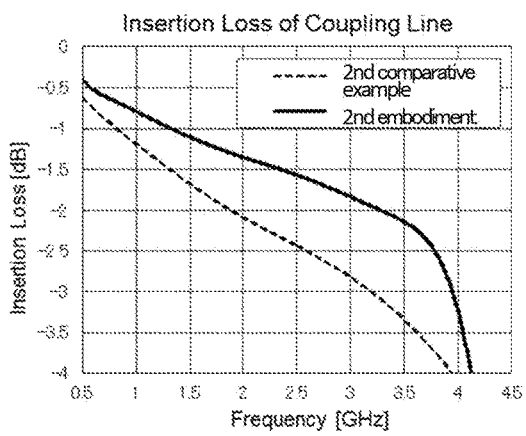
Figure 27D:
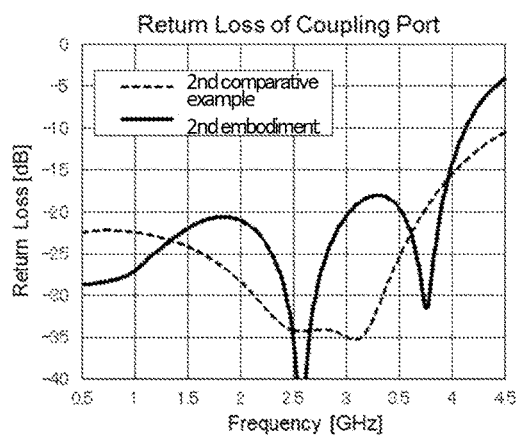

FIGS. 27A to 27D are graphs each illustrating the frequency characteristics of the directional coupler 300 according to the second embodiment and those of the directional coupler 300A according to the second comparative example. FIG. 27A illustrates isolation characteristics, FIG. 27B illustrates coupling characteristics, FIG. 27C illustrates insertion loss of the sub line, and FIG. 27D illustrates return loss of the coupling terminal.

The directional coupler 300 and the directional coupler 300A are almost equivalent in terms of isolation characteristics and return loss illustrated in FIGS. 27A and 27D. On the other hand, regarding the coupling characteristics illustrated in FIG. 27B, since the directional coupler 300 according to the second embodiment obtains a larger inductance, the peak point shifts to a low frequency side, with the result that coupling is achieved in a wider frequency band. Regarding the insertion loss illustrated in FIG. 27C as well, the directional coupler 300 according to the second embodiment has lower loss.

Third Embodiment

Figure 28:
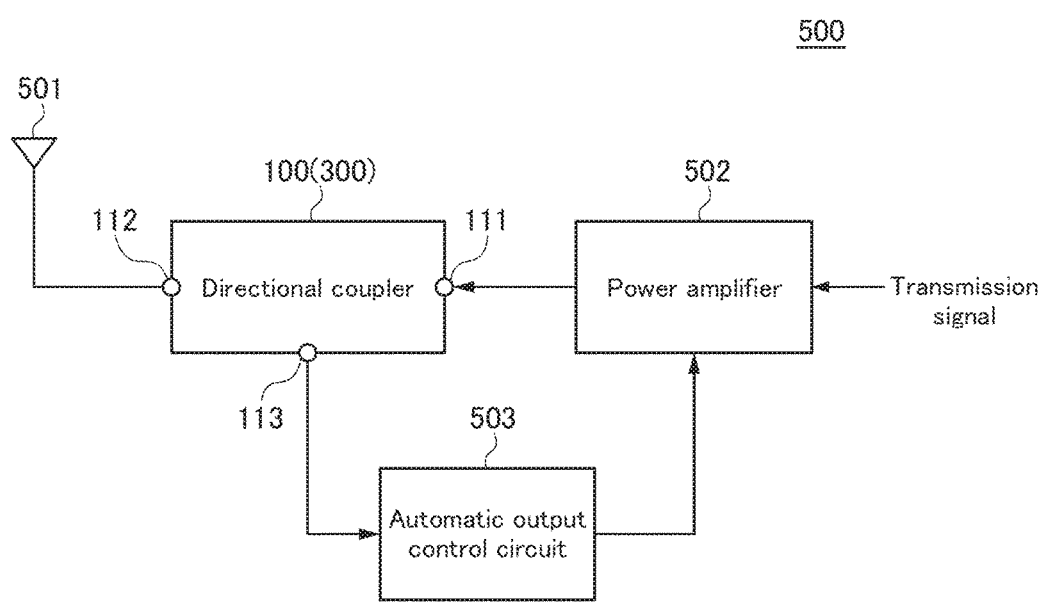
FIG. 28 is a block diagram of a wireless communication device using the directional coupler according to the first or second embodiment.

FIG. 28 is a block diagram of a wireless communication device 500 using the directional coupler 100 or directional coupler 300.

The wireless communication device 500 illustrated in FIG. 28 includes an antenna 501, a power amplifier 502 that supplies a transmission signal to the antenna 501, an automatic output control circuit 503 that adjusts the gain of the power amplifier 502, and the above-described directional coupler 100 or directional coupler 300 connected between the antenna 501 and the power amplifier 502. Specifically, the terminal electrode 111 and the terminal electrode 112 of the directional coupler 100 or 300 are connected to the power amplifier 502 and the antenna 501, respectively. In this configuration, a transmission signal supplied from the power amplifier 502 is transmitted to the antenna 501 by way of the main line of the directional coupler 100 or 300.

The terminal electrode 113 of the directional coupler 100 or directional coupler 300 is connected to the automatic output control circuit 503. Since the terminal electrode 113 is connected to the sub line, a part of electric power of a transmission signal flowing in the main line is supplied to the automatic output control circuit 503 as a detection signal. Then, the automatic output control circuit 503 adjusts the gain of the power amplifier 502 according to the detection signal supplied from the sub line. Through such feedback control, the power of a signal transmitted from the antenna 501 can be automatically adjusted.

It is apparent that the present invention is not limited to the above embodiments, but may be modified and changed without departing from the scope and spirit of the invention.

For example, in the above first and second embodiments, the ground pattern is formed on a conductor layer different from the layer on which the main line and sub line are formed; however, the present invention is not limited to this, but the ground pattern may be formed on the same conductor layer as the layer on which the main line and/or the sub line are/is formed.

Further, in the first and second embodiments, the planar spiral-shaped coil pattern is used as an inductance pattern; however, the present invention is not limited to this, but a helical-shaped or a meandering inductance pattern may be used.

What is claimed is:
1. A directional coupler comprising:
  a main line configured to transmit a high-frequency signal;
  a sub line electromagnetically coupled to the main line;

a ground pattern positioned at least partially between the main line and the sub line in a plan view;
an input terminal connected to one end of the main line;
an output terminal connected to other end of the main line;
a coupling terminal connected to one end of the sub line;
an end terminal connected to other end of the sub line; and
a ground terminal connected to the ground pattern,
wherein the sub line includes a low pass filter having an inductance pattern and a capacitor,
wherein the inductance pattern includes a planar spiral-shaped coil pattern, and
wherein the ground pattern has an opening that overlaps at least an inner diameter part of the coil pattern without overlapping the main line in the plan view.

2. The directional coupler as claimed in claim 1, wherein the main line has a meandering shape.

3. The directional coupler as claimed in claim 1, wherein an outer periphery of the opening is closed.

4. The directional coupler as claimed in claim 1, wherein the opening overlaps all turns of the coil pattern excluding an outermost turn of the coil pattern in the plan view.

5. The directional coupler as claimed in claim 1,
wherein the coil pattern includes first and second coil patterns provided on a same conductor layer, and
wherein the opening overlaps at least partially both the first and second coil patterns in the plan view.

6. The directional coupler as claimed in claim 1,
wherein the coil pattern includes first, second, third, and fourth coil patterns provided on a same conductor layer, and
wherein the opening includes a first opening that overlaps at least partially both the first and second coil patterns in the plan view and a second opening that overlaps at least partially both the third and fourth coil patterns in the plan view.

7. The directional coupler as claimed in claim 1,
wherein the ground terminal is disposed between the coupling terminal and the end terminal, and
wherein the directional coupler further comprises a dummy terminal disposed between the input terminal and the output terminal.

8. The directional coupler as claimed in claim 7, wherein the main line is disposed in proximity to a part of the sub line provided on a same conductor layer at a portion where the mainline bypasses the dummy terminal in the plan view and overlaps other part of the sub line provided on a different conductor layer in the plan view.

9. The directional coupler as claimed in claim 7, wherein the capacitor is disposed between the coupling terminal and the ground terminal and between the end terminal and the ground terminal in the plan view.

10. The directional coupler as claimed in claim 1, wherein the main line is greater in width than the sub line.

11. A wireless communication device comprising:
an antenna;
a power amplifier that supplies a transmission signal to the antenna;
an automatic output control circuit that adjusts a gain of the power amplifier; and
a directional coupler comprising:
a main line configured to transmit the transmission signal;
a sub line electromagnetically coupled to the main line; and
a ground pattern positioned at least partially between the main line and the sub line in a plan view,
wherein the sub line includes a low pass filter having an inductance pattern and a capacitor,
wherein the inductance pattern includes a planar spiral-shaped coil pattern,
wherein the ground pattern has an opening that overlaps at least an inner diameter part of the coil pattern without overlapping the main line in the plan view,
wherein the main line of the directional coupler is connected between the antenna and the power amplifier,
wherein the sub line of the directional coupler is connected to the automatic output control circuit, and
wherein the automatic output control circuit adjusts the gain of the power amplifier according to a detection signal supplied from the sub line.

12. A directional coupler comprising:
first, second, third, fourth, and fifth terminal electrodes;
a main line connected between the first and second terminal electrodes;
a sub line connected between the third and fourth terminal electrodes; and
a ground pattern connected to the fifth terminal electrode;
wherein the main line has a first meandering section,
wherein the sub line has a spiral section and a second meandering section,
wherein the first meandering section is formed on a first conductor layer,
wherein the second meandering section is formed on a second conductor layer such that the second meandering section extends along the first meandering section,
wherein the ground pattern is formed on a third conductor layer, and
wherein the ground pattern has an opening that overlaps with the spiral section of the sub line.

13. The directional coupler as claimed in claim 12, wherein the first and second meandering sections do not overlap with the opening of the ground pattern.

14. The directional coupler as claimed in claim 13, wherein the first and second meandering sections do not overlap with the ground pattern.

15. The directional coupler as claimed in claim 12, wherein the second conductor layer is positioned between the first and third conductor layers.

16. The directional coupler as claimed in claim 12, wherein the sub line is greater in length than the main line.

17. The directional coupler as claimed in claim 12, wherein the first meandering section is greater in width than the second meandering section.

18. The directional coupler as claimed in claim 12, wherein an outer periphery of the opening is closed.

19. The directional coupler as claimed in claim 12,
wherein the first and second terminal electrodes are arranged in a first direction,
wherein the third and fourth terminal electrodes arranged in the first direction,
wherein the first and third terminal electrodes are arranged in a second direction substantially perpendicular to the first direction,
wherein the second and fourth terminal electrodes are arranged in the second direction, and
wherein the fifth terminal electrode is arranged between the third and fourth terminal electrodes.

20. The directional coupler as claimed in claim 19, further comprising a sixth terminal electrode arranged between the first and second terminal electrodes,
wherein the fifth and sixth terminal electrodes are arranged in the second direction, and wherein parts of the first and second meandering sections are located between the first and sixth terminal electrodes and between the second and sixth terminal electrodes so as not to overlap with the sixth terminal electrode.

* * * * *